United States Patent
Choi et al.

(10) Patent No.: US 9,379,018 B2
(45) Date of Patent: Jun. 28, 2016

(54) INCREASING ION/IOFF RATIO IN FINFETS AND NANO-WIRES

(71) Applicant: SYNOPSYS, INC., Mountain View, CA (US)

(72) Inventors: Munkang Choi, Pleasanton, CA (US); Victor Moroz, Saratoga, CA (US); Xi-Wei Lin, Fremont, CA (US)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 14/491,908

(22) Filed: Sep. 19, 2014

(65) Prior Publication Data

US 2015/0041921 A1      Feb. 12, 2015

Related U.S. Application Data

(63) Continuation-in-part of application No. 13/717,532, filed on Dec. 17, 2012, now Pat. No. 8,847,324, and a continuation of application No. PCT/US2013/075814, filed on Dec. 17, 2013.

(51) Int. Cl.
*H01L 21/8234* (2006.01)
*H01L 29/66* (2006.01)
(Continued)

(52) U.S. Cl.
CPC ......... *H01L 21/823431* (2013.01); *B82Y 10/00* (2013.01); *H01L 27/0886* (2013.01);
(Continued)

(58) Field of Classification Search
CPC ....... H01L 21/336; H01L 21/28; H01L 29/88; H01L 29/78; H01L 29/788; H01L 31/0328; H01L 31/072; H01L 27/10
See application file for complete search history.

(56) References Cited

U.S. PATENT DOCUMENTS

| 4,885,618 A | 12/1989 | Schubert et al. |
| 5,600,578 A | 2/1997 | Fang et al. |

(Continued)

FOREIGN PATENT DOCUMENTS

| JP | 11-289089 | 10/1999 |
| KR | 10-1031798 B1 | 4/2011 |

OTHER PUBLICATIONS

Hisamoto D., et al., "A Folded-channel MOSFET for Deep sub-tenth Micron Era", IEEE International Electron Device Meeting Technical Digest, Dec. 6-9, 1998, pp. 1032-1034.

(Continued)

*Primary Examiner* — Whitney T Moore
(74) *Attorney, Agent, or Firm* — Haynes Beffel & Wolfeld LLP

(57) ABSTRACT

Roughly described, an integrated circuit transistor structure has a body of semiconductor material, the body having two longitudinally spaced doped source/drain volumes with a channel between, a gate stack disposed outside the body and facing at least one of the surfaces of the body along the channel. The body contains an adjustment volume, longitudinally within the channel volume and spaced behind the first surface by a first distance and spaced longitudinally from both the source/drain volumes. The adjustment volume comprises an adjustment volume material having, at each longitudinal position, an electrical conductivity which differs from that of the adjacent body material at the same longitudinal position, at least while the transistor is in an off-state. In one embodiment the adjustment volume material is a dielectric. In another embodiment the adjustment volume material is an electrical conductor.

64 Claims, 17 Drawing Sheets

(51) Int. Cl.
  *H01L 29/78* (2006.01)
  *H01L 27/088* (2006.01)
  *B82Y 10/00* (2011.01)
  *H01L 29/423* (2006.01)
  *H01L 29/775* (2006.01)
  *H01L 29/06* (2006.01)
  *H01L 29/40* (2006.01)

(52) U.S. Cl.
  CPC .......... *H01L29/0673* (2013.01); *H01L 29/402* (2013.01); *H01L 29/42376* (2013.01); *H01L 29/66439* (2013.01); *H01L 29/66795* (2013.01); *H01L 29/775* (2013.01); *H01L 29/785* (2013.01)

(56) References Cited

U.S. PATENT DOCUMENTS

| | | |
|---|---|---|
| 5,606,518 A | 2/1997 | Fang et al. |
| 6,420,231 B1 | 7/2002 | Harari et al. |
| 6,593,176 B2 | 7/2003 | Dennison |
| 6,599,781 B1 | 7/2003 | Li |
| 6,706,571 B1 | 3/2004 | Yu et al. |
| 6,812,508 B2 | 11/2004 | Fukumi |
| 6,831,292 B2 | 12/2004 | Currie et al. |
| 6,881,632 B2 | 4/2005 | Fitzgerald et al. |
| 7,190,050 B2 | 3/2007 | King et al. |
| 7,224,019 B2 | 5/2007 | Hieda et al. |
| 7,266,787 B2 | 9/2007 | Hughes et al. |
| 7,291,519 B2 | 11/2007 | Bhattacharyya |
| 7,307,273 B2 | 12/2007 | Currie |
| 7,337,420 B2 | 2/2008 | Chidambarrao et al. |
| 7,358,142 B2 | 4/2008 | Kang et al. |
| 7,437,260 B2 | 10/2008 | Ausserlechner et al. |
| 7,440,861 B2 | 10/2008 | Ausserlechner et al. |
| 7,484,198 B2 | 1/2009 | Lin et al. |
| 7,504,678 B2 | 3/2009 | Chau et al. |
| 7,528,465 B2 | 5/2009 | King et al. |
| 7,542,891 B2 | 6/2009 | Lin et al. |
| 7,714,397 B2 | 5/2010 | Hareland et al. |
| 7,921,401 B2 | 4/2011 | Ito et al. |
| 7,960,232 B2 | 6/2011 | King et al. |
| 8,086,990 B2 | 12/2011 | Lin et al. |
| 8,222,680 B2 | 7/2012 | Lin et al. |
| 8,604,518 B2 | 12/2013 | Bhuwalka et al. |
| 2003/0119247 A1 | 6/2003 | Suwa et al. |
| 2003/0173588 A1 | 9/2003 | Bianchi |
| 2004/0044511 A1 | 3/2004 | Sekido et al. |
| 2004/0059559 A1 | 3/2004 | Shimizu et al. |
| 2004/0075122 A1 | 4/2004 | Lin et al. |
| 2004/0075149 A1 | 4/2004 | Fitzgerald et al. |
| 2004/0099925 A1 | 5/2004 | Poveda |
| 2004/0108559 A1 | 6/2004 | Sugii et al. |
| 2004/0153986 A1 | 8/2004 | Sahara et al. |
| 2004/0217448 A1 | 11/2004 | Kumagai et al. |
| 2005/0017304 A1 | 1/2005 | Matsushita et al. |
| 2005/0023569 A1 | 2/2005 | Yang |
| 2005/0040460 A1 | 2/2005 | Chidambarrao et al. |
| 2005/0056892 A1 | 3/2005 | Seliskar |
| 2005/0073005 A1 | 4/2005 | Nowak et al. |
| 2005/0077511 A1 | 4/2005 | Fitzergald |
| 2005/0093059 A1 | 5/2005 | Belyansky et al. |
| 2005/0104057 A1 | 5/2005 | Shaheed et al. |
| 2005/0110039 A1 | 5/2005 | Chi et al. |
| 2005/0112822 A1 | 5/2005 | Litwin |
| 2005/0121727 A1 | 6/2005 | Ishitsuka et al. |
| 2005/0139929 A1 | 6/2005 | Rost |
| 2005/0158931 A1 | 7/2005 | Chen et al. |
| 2005/0176204 A1 | 8/2005 | Langdo et al. |
| 2005/0184345 A1 | 8/2005 | Lin et al. |
| 2005/0202604 A1 | 9/2005 | Cheng et al. |
| 2005/0224800 A1 | 10/2005 | Lindert et al. |
| 2005/0224875 A1 | 10/2005 | Anderson et al. |
| 2005/0224890 A1 | 10/2005 | Bernstein et al. |
| 2005/0239254 A1 | 10/2005 | Chi et al. |
| 2005/0247926 A1 | 11/2005 | Sun et al. |
| 2005/0280121 A1 | 12/2005 | Doris et al. |
| 2005/0285186 A1 | 12/2005 | Fujiwara |
| 2006/0003510 A1 | 1/2006 | Kammler et al. |
| 2006/0019458 A1 | 1/2006 | Chidambarrao et al. |
| 2006/0043529 A1 | 3/2006 | Chidambarrao et al. |
| 2006/0091475 A1 | 5/2006 | Fujii et al. |
| 2006/0113603 A1 | 6/2006 | Currie |
| 2006/0142987 A1 | 6/2006 | Ishizu et al. |
| 2006/0157687 A1 | 7/2006 | Doyle et al. |
| 2006/0186478 A1 | 8/2006 | Hughes et al. |
| 2006/0190893 A1 | 8/2006 | Morton |
| 2006/0228863 A1 | 10/2006 | Zhang et al. |
| 2006/0240650 A1 | 10/2006 | Orlowski et al. |
| 2006/0267130 A1 | 11/2006 | Rao |
| 2007/0026599 A1 | 2/2007 | Peidous et al. |
| 2007/0028195 A1 | 2/2007 | Chidambarrao et al. |
| 2007/0096170 A1 | 5/2007 | Chidambarrao et al. |
| 2007/0096206 A1 | 5/2007 | Chidambarrao |
| 2007/0108531 A1 | 5/2007 | Chidambarrao |
| 2007/0235763 A1 | 10/2007 | Doyle et al. |
| 2007/0292996 A1 | 12/2007 | Abadeer et al. |
| 2008/0127005 A1 | 5/2008 | Lin et al. |
| 2008/0195983 A1 | 8/2008 | Chidambarrao et al. |
| 2009/0057777 A1 | 3/2009 | Fujii et al. |
| 2009/0095987 A1 | 4/2009 | Rost |
| 2009/0217217 A1 | 8/2009 | Lin et al. |
| 2011/0163369 A1 | 7/2011 | Xiao et al. |
| 2013/0102116 A1 | 4/2013 | Xiao et al. |
| 2013/0134522 A1 | 5/2013 | Bhuwalka |

OTHER PUBLICATIONS

Lindert N. et al., "Sub-60-nm Quasi-Planar FinFETs Fabricated Using a Simplified Process," IEEE Electron Device Letters, 22, Oct. 2001, pp. 487-489.

R.A. Bianchi et al., "Accurate Modeling of Trench Isolation Induced Mechanical Stress Effects on MOSFET Electrical Performance," IEEE IEDM Tech. Digest, pp. 117-120 (Dec. 2002).

Xuemei (Jane) Xi, et al., "BSIM4.3.0 Model, Enhancements and Improvements Relative to BSIM4.2.1", University of California at Berkeley (2003) available at http://www-devices.eecs.berkeley.edu/~bsim3/BSIM4/BSIM430/doc/BSIM430_Enhancement.pdf.

F. Nouri et al., "A Systematic Study of Trade-offs in Engineering a Locally Strained pMOSFET", Proc. IEDM, pp. 1055-1058, 2004.

S.E. Thompson et al., "A 90-nm Logic Technology Featuring Strained-Silicon", IEEE Transactions on Electron Devices, 2004.

G. Eneman et al., "Layout Impact on the Performance of a Locally Strained PMOSFET", 2005 Symposium on VLSI Technology Digest of Technical Papers, pp. 22-23, 2005.

V. Moroz et al., "Analyzing strained-silicon options for stress-engineering transistors", Solid State Technology, Jul. 2004.

Y. Kanda, "A Graphical Representation of the Piezoresistance Coefficients in Silicon", IEEE Transactions on Electron Devices, vol. Ed-29, No. 1, Jan. 1982.

C.S. Smith, "Piezoresistance Effect in Germanium and Silicon", Physical Review, vol. 94, No. 1, Apr. 1, 1954.

Smith, et al., "Exploring the Limits of Stress-Enhanced Hole Mobility", IEEE Electron Device Letters, vol. 26, No. 9, Sep. 2005.

Moroz, et al., "Options at the 45 nm node include engineered substrates", Solid State Technology, Jul. 2005.

Gildenblat, G., et al., "PSP Model" Department of Electrical Engineering, The Pennsylvania State University and Philips Research, (Aug. 2005) 82 pages.

Radosavljevic, M., et al., "Electrostatics Improvement in 3-D Tri-gate Over Ultra-Thin Body Planar InGaAs Quantum Well Field EffectTransistors with High-K Gate Dielectric and Scaled Gate-to-Drain/Gate-to-Source Separation," 2011 IEEE International Electron Devices Meeting (IEDM), #278, 3 pgs.

Radosavljevic, M., et al., "Non-Planar, Multi-Gate InGaAs Quantum Well Field Effect Transistors with High-K Gate Dielectric and Ultra-Scaled Gate-to-Drain/Gate-to-Source Separation for Low Power Logic Applications," 2010 IEEE International ElectronDevices Meeting (IEDM), pp. 126-129.

(56) References Cited

OTHER PUBLICATIONS

Choi et al., "A spacer patterning technology for nanoscale CMOS," IEEE Transactions on Electron Devices, vol. 49, No. 3, pp. 436-441, Mar. 2002.

Quirk et al. Semiconductor Manufacturing Technology, 2001, Prentice Hall, 67 pages.

Brigham Young University, Crystal Planes in Semiconductors, 2010, http://cleanroom.byu.edu/EW.sub.--orientation. phtml, pp. 1-2.

PCT/US2013/075814—International Search Report and Written Opinioin dated Apr. 23, 2014, 15 pages.

EP 13 865 817.4—Response to Office Action dated Jul. 24, 2015 filed Oct. 16, 2015, 16 pages.

TW 102146672—Office Action dated Oct. 21, 2015, 32 pages.

TW 102146672—Response to first Office Action dated Oct. 21, 2015, 37 pages.

OFF-STATE CURRENT

OFF-STATE LEAKAGE
CURRENT

OFF-STATE ELECTROSTATIC
POTENTIAL

OFF-STATE LEAKAGE
CURRENT

OFF-STATE ELECTROSTATIC
POTENTIAL

OFF-STATE LEAKAGE
CURRENT

OFF-STATE ELECTROSTATIC
POTENTIAL

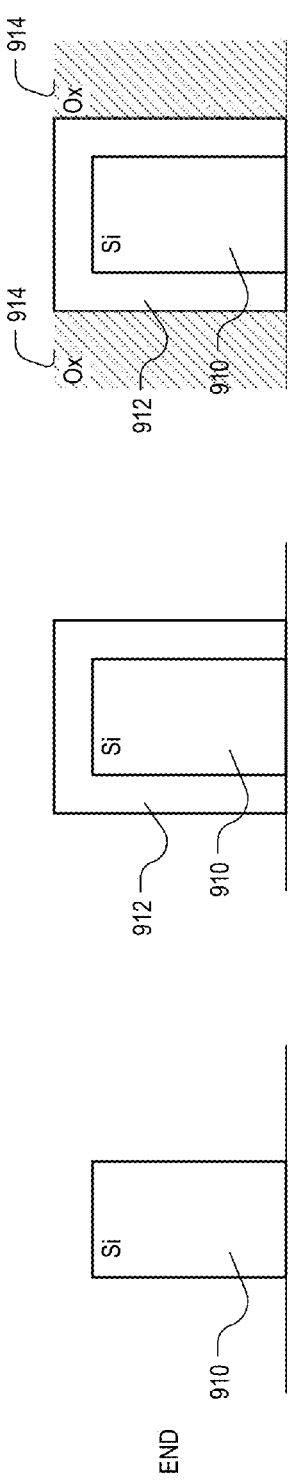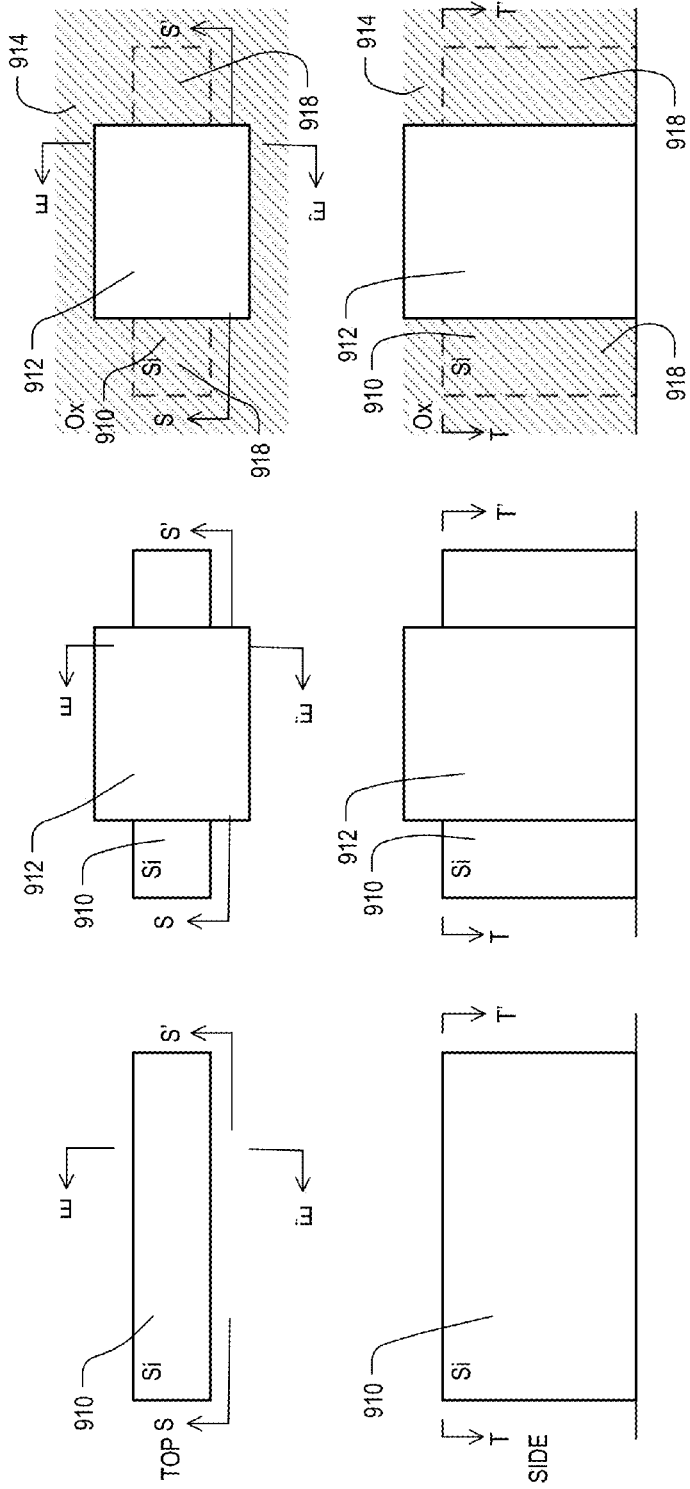
FIG. 9A   FIG. 9B   FIG. 9C

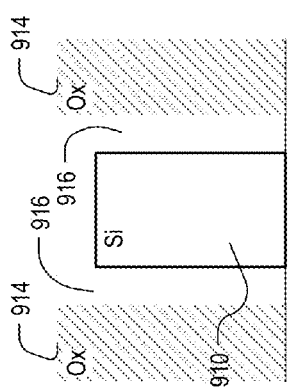
FIG. 9D
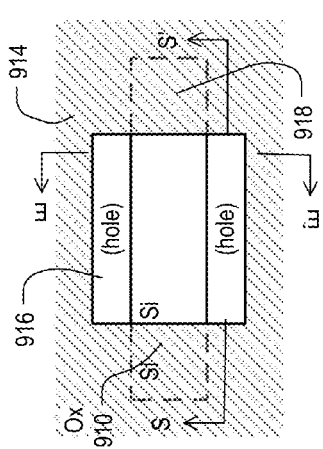
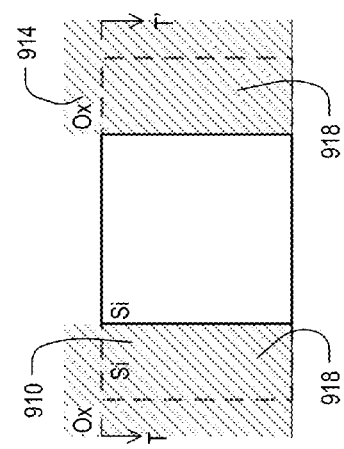
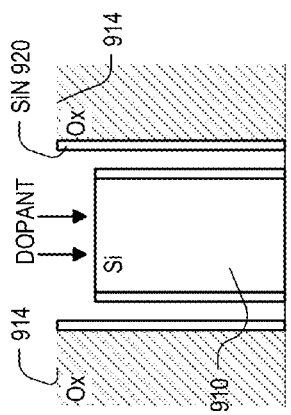
FIG. 9E
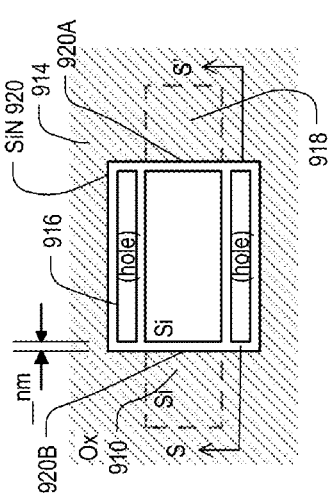
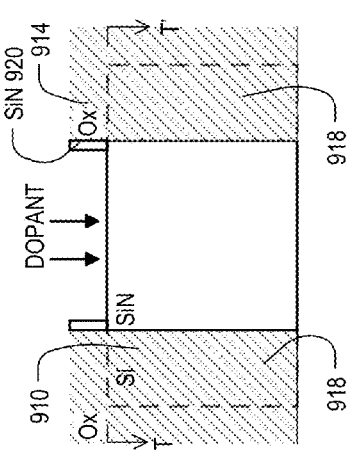
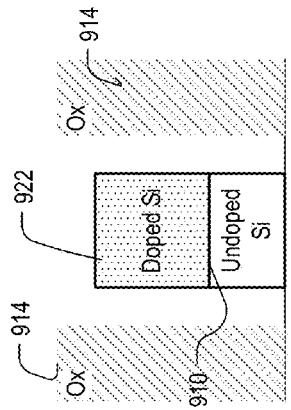
FIG. 9F
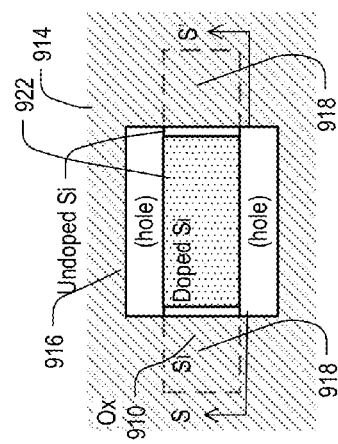
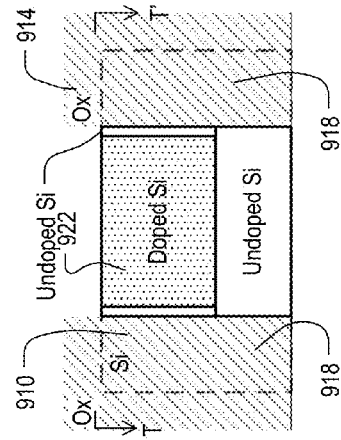

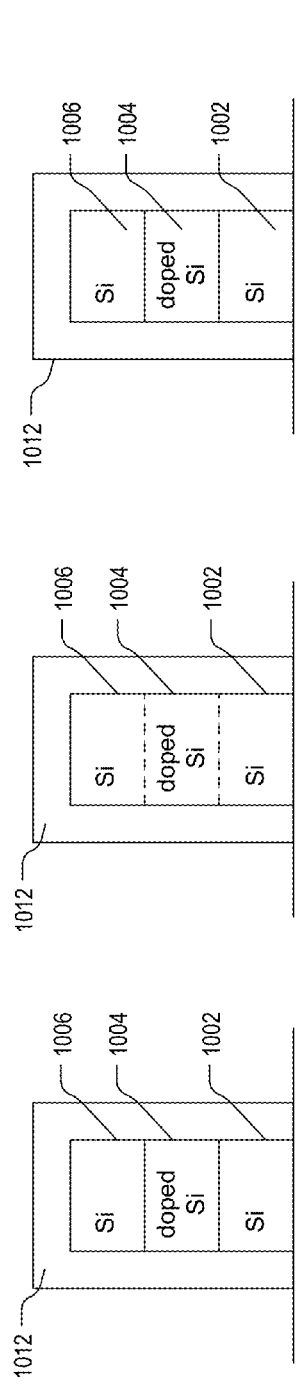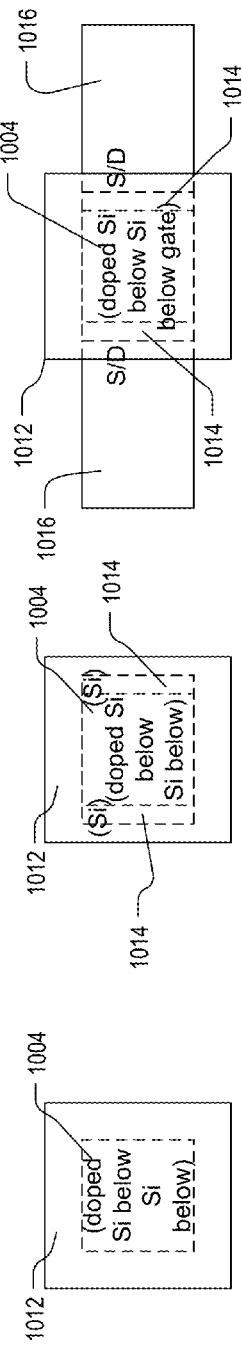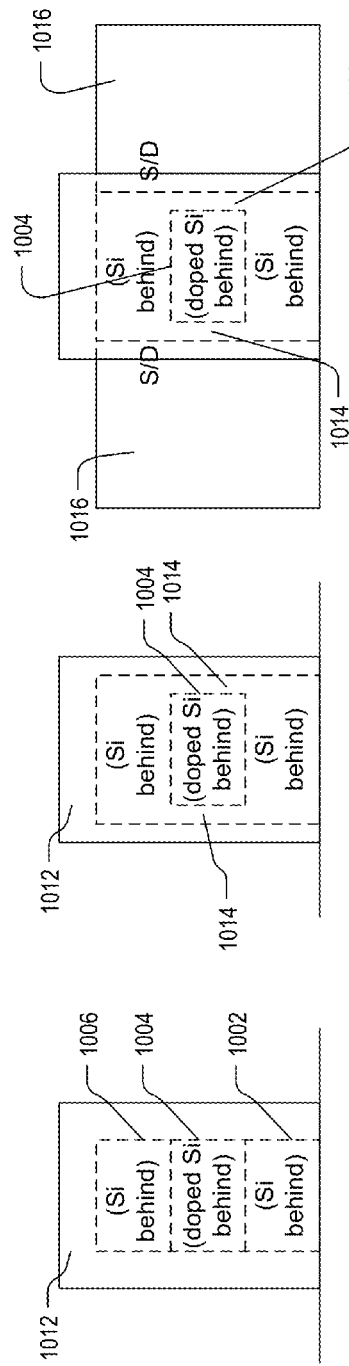

SCRIBE LINES 1299   FIG. 12A

US 9,379,018 B2

INCREASING ION/IOFF RATIO IN FINFETS AND NANO-WIRES

CROSS REFERENCES

This application is a continuation-in-part of, and claims priority to, U.S. application Ser. No. 13/717,532, filed 17 Dec. 2012, now U.S. Pat. No. 8,847,324.

This application is also a continuation of, and claims priority to, PCT Application No. PCT/US13/75814, filed 17 Dec. 2013, which is a continuation-in-part of, and claims priority to, U.S. application Ser. No. 13/717,532, filed 17 Dec. 2012, now U.S. Pat. No. 8,847,324.

All the above-listed applications are incorporated by reference herein in their entirety.

BACKGROUND

The invention relates to semiconductor fabrication, and more particularly to a technique for increasing Ion/Ioff ratios in FinFETs, nano-wires, and other similar structures.

As integrated circuit technologies continue to push into higher densities, a number of transistor types have become popular which involve one or more narrow channel structures wrapped with a gate electrode. The channel structures are often called fins, and transistors that include them are sometimes called FinFETs, described for example in D. Hisamoto et al., IEDM, 1998; and N. Lindert et al., IEEE Electron Device Letters, p. 487, 2001, both incorporated by reference herein for their teachings. The fins comprise semiconductor bodies usually arranged in parallel on the substrate, so that they project vertically upwards from the substrate. A gate dielectric layer overlies the sides and top of the fins, and a gate conductor, which can be implemented using metal or polysilicon for example, extends across the fins and over the gate dielectric layer. On either side of the gate conductor, source and drain regions are implemented in the fins. The FET transistors that result have source, channel and drain regions in the fins, and a gate overlying the fins. Such transistors are often called multi-gate transistors, because the gate conductor wraps around three sides of the fins, and as a result increases the effective width of the channel. In a future proposed structure the gate wraps entirely around the channel structure, in which case the multi-gate transistor is sometimes called a nano-wire. As used herein, however, nano-wires are considered a special case of FinFETs and the channel structures are still sometimes referred to herein as fins.

The fins used to implement the FinFET transistors can be quite narrow. As a result of the multi-gate gate structure and the narrow widths of the fins, FinFET transistors have excellent performance characteristics and small layout areas. But even with such narrow fins, the electric field generated by the gate control voltage when the device is in its off state can be limited in depth and may not extend sufficiently into the cross-sectional middle of the fin. This causes leakage through the middle of the fin. The wider the fin, the higher the leakage because the middle is too far from the gate to be under gate voltage control. Thus the Ion/Ioff ratio suffers. Manufacturers can reduce this problem by narrowing the fin further, but this solution is difficult to implement because the mechanical instability and line edge roughness of such a narrow fin can cause yield loss.

Accordingly, there is a need for better ways to improve the Ion/Ioff ratio in multi-gate transistors.

SUMMARY

An opportunity therefore arises to create robust solutions to the problem of reduced Ion/Ioff ration in multi-gate transistors. Better chip yields, and denser, and more powerful circuits, components and systems may result.

Roughly described, the invention involves an integrated circuit transistor structure having a body of semiconductor material, the body having two longitudinally spaced doped source/drain volumes with a channel between, a gate stack disposed outside the body and facing at least one of the surfaces of the body along the channel. The body contains an "adjustment volume", which is a volume disposed longitudinally within the channel volume, spaced behind the first surface by a first distance, and spaced longitudinally from both the source/drain volumes. In a FinFET embodiment, the adjustment volume may be disposed entirely within the fin. The adjustment volume comprises an adjustment volume material having, at each longitudinal position, an electrical conductivity which differs from that of the adjacent body material at the same longitudinal position, at least while the transistor is in an off-state. In one embodiment the adjustment volume material is a dielectric. In another embodiment the adjustment volume material is an electrical conductor.

The above summary of the invention is provided in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description that is presented later. Particular aspects of the invention are described in the claims, specification and drawings.

BRIEF DESCRIPTION OF THE DRAWINGS

The invention will be described with respect to specific embodiments thereof, and reference will be made to the drawings, in which:

FIG. 2A is a cross-sectional view of the channel volume of the transistor of FIG. 1.

FIG. 2B is a top view of the transistor of FIG. 1, taken from a horizontal 2D slice through the middle of the fin height, and colored to show off-state leakage current densities.

FIG. 2C is a top view of the transistor of FIG. 1, taken from a horizontal 2D slice through the middle of the fin height, and colored to show off-state electrostatic potentials.

FIGS. 9A-9I (collectively FIG. 9) illustrate a sequence of steps by which an adjustment volume material can be formed inside a fin as illustrated in FIG. 3.

FIGS. 10A-10F (collectively FIG. 10) illustrate an alternative sequence of steps by which an adjustment volume material can be formed inside a fin as illustrated in FIG. 10F.

FIGS. 12A, 12B, 12C, and 12D are top views of different corrugated substrates that incorporate features of the invention

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1C:
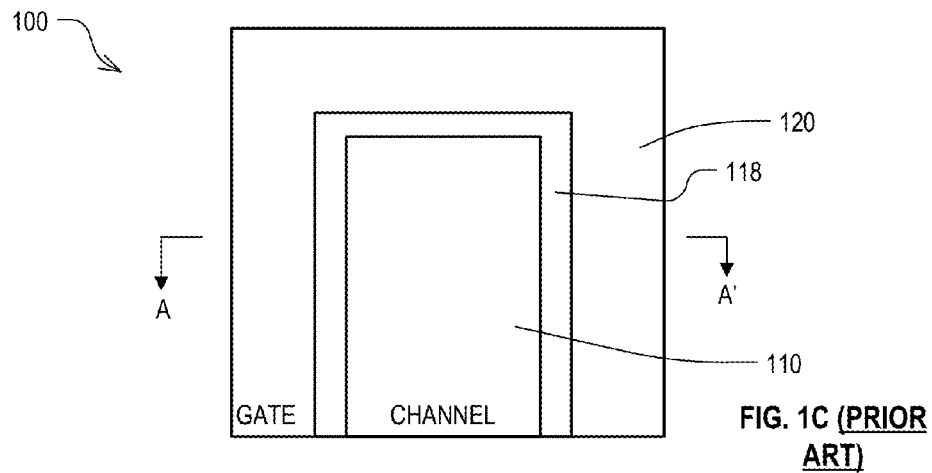
FIGS. 1D, 1C, 1A and 1B (collectively FIG. 1) illustrate a simplified prior art FinFET transistor.
Figure 1A:
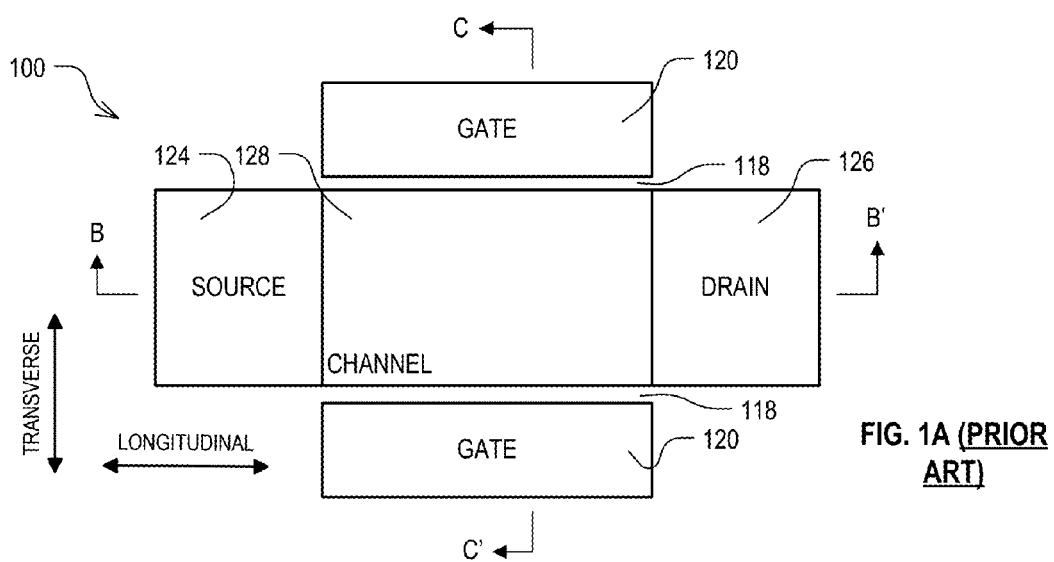
Figure 1B:
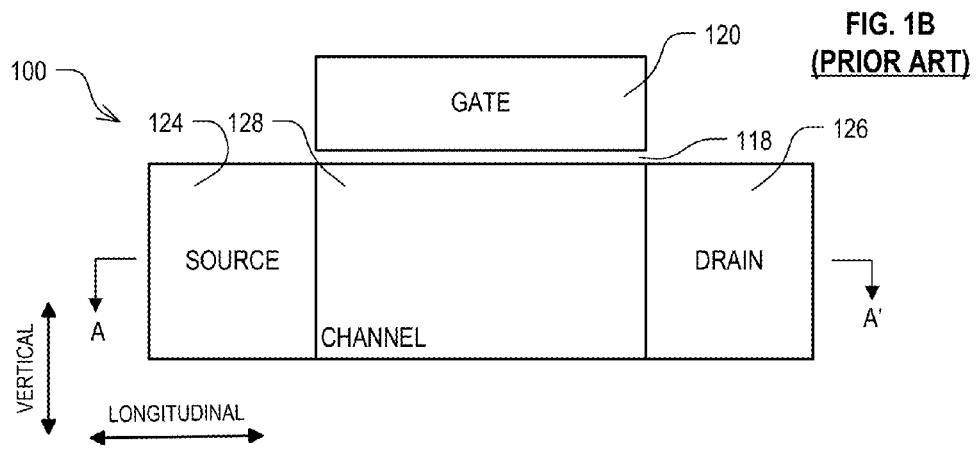
Figure 1D:
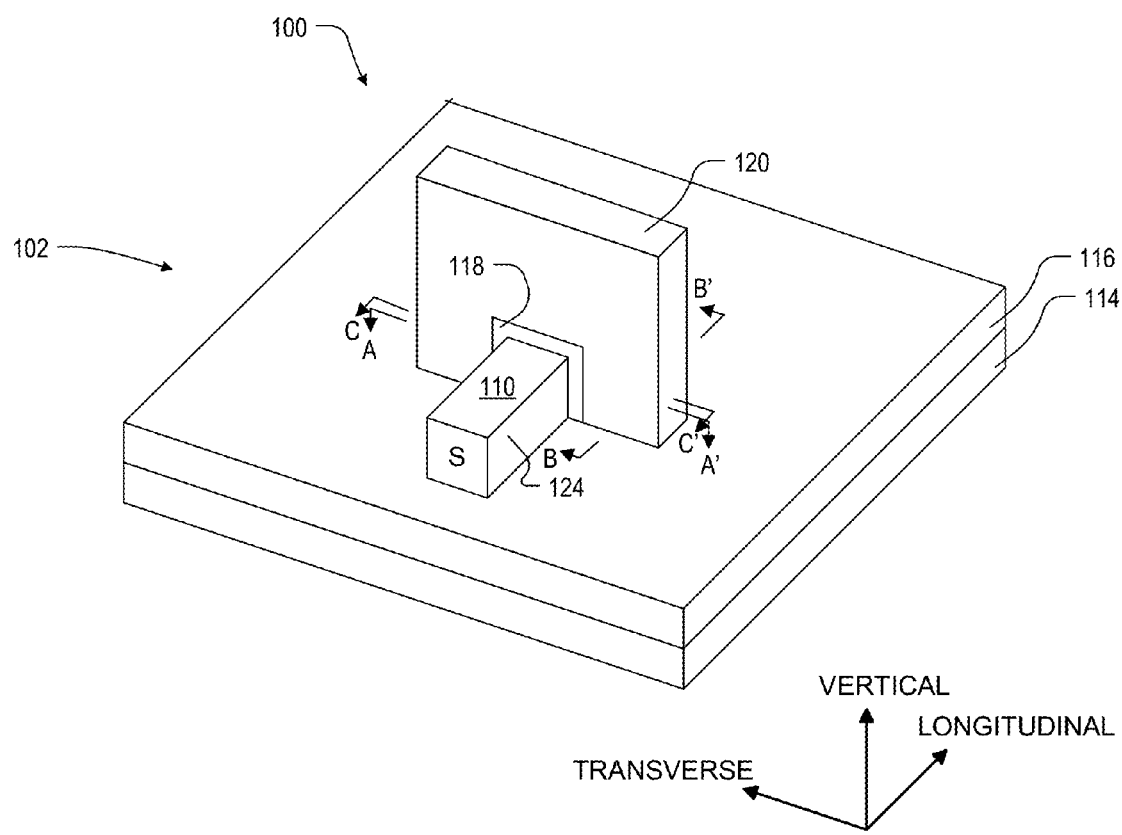

FIG. 1D is a perspective view of a simplified FinFET transistor 100 on an SOI wafer 102. As with all mechanical drawings herein, FIG. 1D is not drawn to scale. A bulk silicon substrate 114 underlies a buried oxide layer 116, and an undoped silicon layer above them has been patterned with a fin (body 110) having longitudinally separated source and drain volumes for the transistor 100. In other embodiments, the buried oxide layer 116 can be omitted, or the silicon body 110 can extend down through the oxide layer 116 (which may in such an embodiment be STI) into the bulk silicon substrate 114. In any of these cases the fin 110 can be said to extend vertically from the wafer surface.

In the drawing, only the source volume 124 is visible, the drain region being hidden behind the gate structures. Also, while FIG. 1D shows only one fin 110, typically a number of fins are formed in parallel and connected together at their respective ends to common source and drain landing pads, respectively. For clarity of illustration, though only one fin is shown in FIG. 1D. In addition, while the body 110 in FIG. 1D is entirely undoped silicon, as used herein, the term "body" does not necessarily require that the structure be all of a single material. Nor does it need to be physically separate from an adjacent body of a different material.

A gate dielectric layer 118 overlies and wraps around the silicon body 110. The gate dielectric 118 may be a single material or a composite of more than one material, all of which are collectively referred to herein as the gate dielectric. A gate conductor 120, which can be implemented using metal or polysilicon for example, overlies and wraps around the gate dielectric 118. As with the gate dielectric 118, the gate conductor 120 can be implemented using a single material or a composite of more than one material, all of which are collectively referred to herein as the gate conductor 120. The combination of gate dielectric 118 and gate conductor 120 is sometimes referred to herein as a gate stack, there being no implication herein that a stack must necessarily be vertical. FIG. 1D also indicates directions of the device referred to herein as longitudinal, transverse and vertical. (The transverse direction also is sometimes referred to herein as the lateral direction.) In a FinFET on which the gate conductor wraps two or more sides of the fin, as in FIG. 1D, the portions of the gate conductor which face different sides of the fin are sometimes referred to herein as different "gates". However, they are also sometimes referred to herein as a single gate or gate conductor.

FIG. 1C is a cross-sectional view of the transistor 100, taken along site lines C-C' of FIG. 1D. The wafer 102 is omitted from FIG. 1C for clarity of illustration. FIG. 1C also indicates the transverse and vertical directions of the device.

FIG. 1A is a top view of the transistor 100, taken along sight lines A-A' of both FIGS. 1D and 1C. The view of FIG. 1C is taken along sight lines C-C' of FIG. 1A. FIG. 1A also indicates the transverse direction of the device, as well as the longitudinal direction. It can be seen that the fin 110 comprises doped volumes 124 and 126 on longitudinally opposite ends of a channel volume 128. The volumes 124 and 126 act as source and drain volumes of the transistor, though typically the choice of which is the source and which is the drain depends on how they are connected in a circuit. These volumes are therefore sometimes referred to herein generically as source/drain volumes. The source/drain volumes 124 and 126 are doped for the same conductivity type (N or P). The channel volume may be undoped silicon, for example, or may be doped to exhibit the conductivity type opposite that of the source/drain volumes. The two sides (but not the top) of the gate conductor 120 also can be seen in FIG. 1A, separated from the channel volume 128 by gate dielectric 118.

FIG. 1B is a side view of the transistor 100, taken along sight lines B-B' of both FIGS. 1D and 1A. The view of FIG. 1A is taken along sight lines A-A' of FIG. 1B. FIG. 1B also indicates the longitudinal and vertical directions of the device. The channel volume 128 of fin 110, as well as the two source/drain regions 124 and 126 can be seen in FIG. 1B. The top part of gate conductor 120 also can be seen in FIG. 1B, separated from the channel volume 128 by gate dielectric 118. FIGS. 1D, 1C, 1A and 1B are sometimes referred to collectively herein as FIG. 1.

Figure 2A:
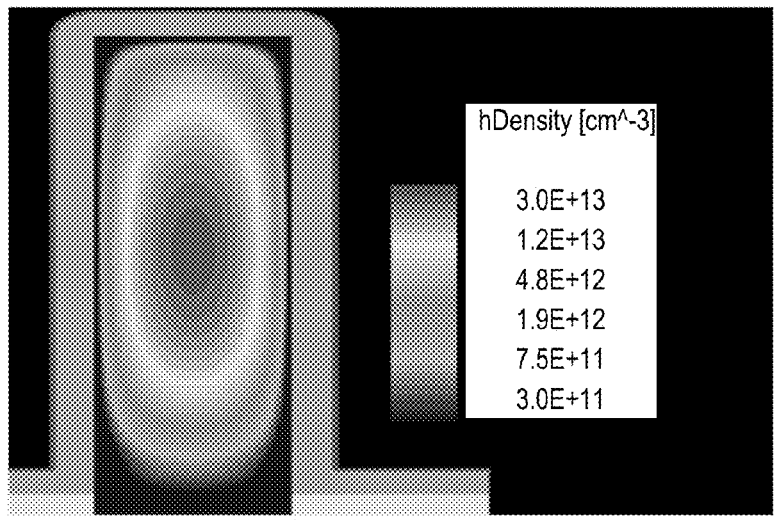
FIGS. 2A, 2B and 2C are sometimes referred to collectively as FIG. 2.

FIG. 2A is a cross-sectional view of the channel volume 128, illustrating by simulation the cross-sectional distribution of current densities in the fin at a particular longitudinal position while the transistor is in the off-state. As used herein, the "off-state" of a transistor is a state of the transistor in which the gate-source voltage is zero and the drain-source voltage is at the power supply voltage Vdd. In these drawings, current density is indicated by color, with colors toward the blue end of the spectrum indicating lower current densities and colors toward the red end of the spectrum indicating higher current densities. It can be seen that leakage currents flow through the channel, and current flow is strongest in the cross-sectional center of the fin where the influence of gate voltage is weakest.

Figure 2B:
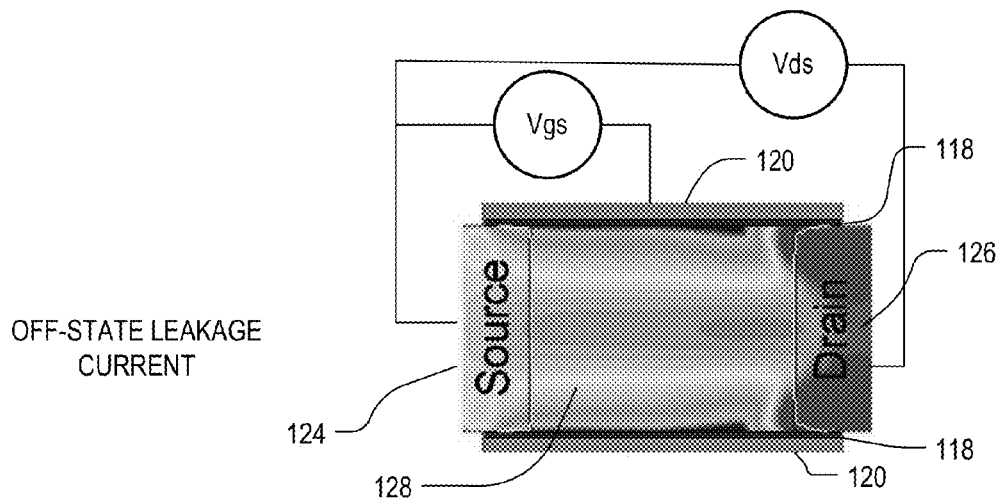

FIG. 2B is a top view of the transistor of FIG. 1A, taken from a horizontal 2D slice through the middle of the fin height, and illustrating by simulation the longitudinal and transverse distribution of current densities in the fin while the transistor is in the off-state. As in FIG. 2A, current density is indicated by color, with colors toward the blue end of the spectrum indicating lower current densities and colors toward the red end of the spectrum indicating higher current densities. It can be seen that leakage currents flow with greatest density in roughly the center of the fin transversely. Again it is noted that this is where the influence of gate voltage is weakest. FIG. 2B also shows the application of voltage biases $V_{DS}$ and $V_{GS}$ to the transistor.

Figure 3C:
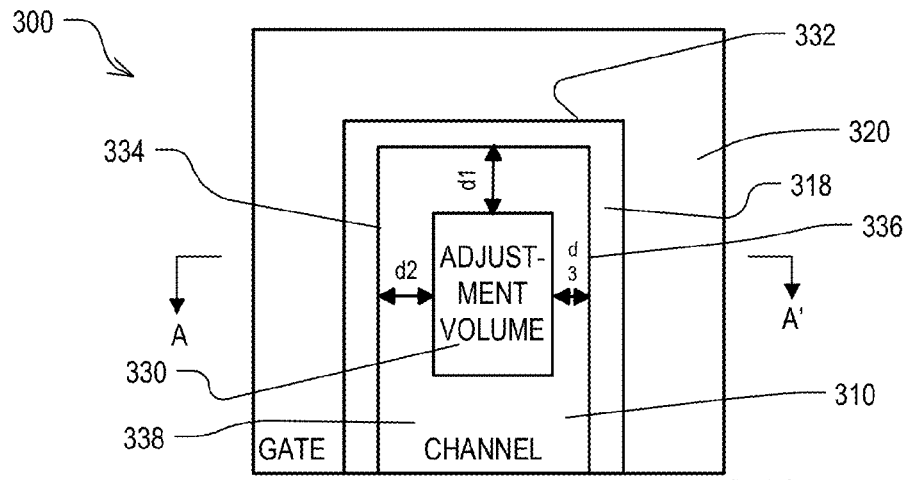
FIGS. 3C, 3A and 3B (collectively FIG. 3) illustrate a simplified FinFET transistor 300, incorporating aspects of the invention.
Figure 3A:
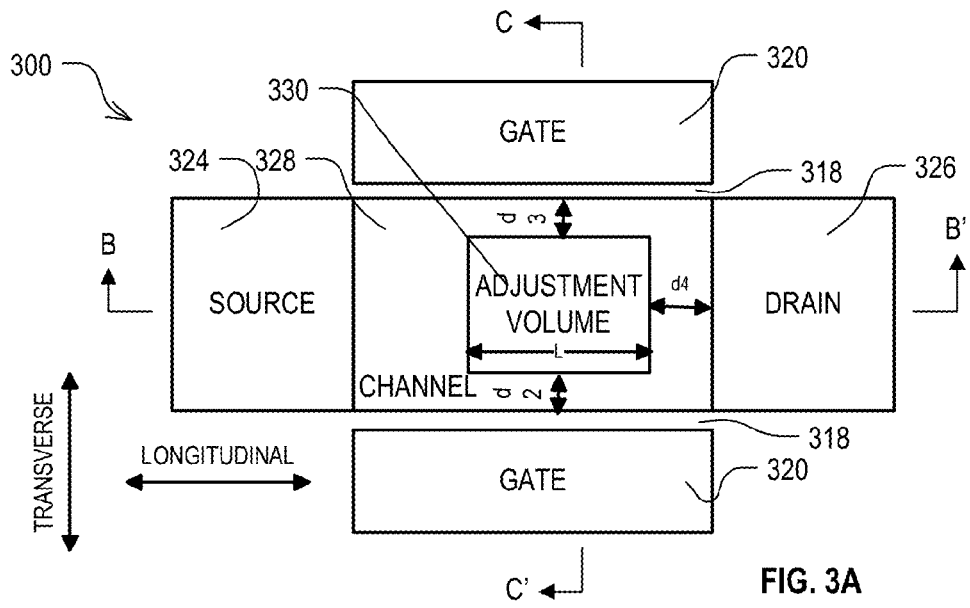
Figure 3B:
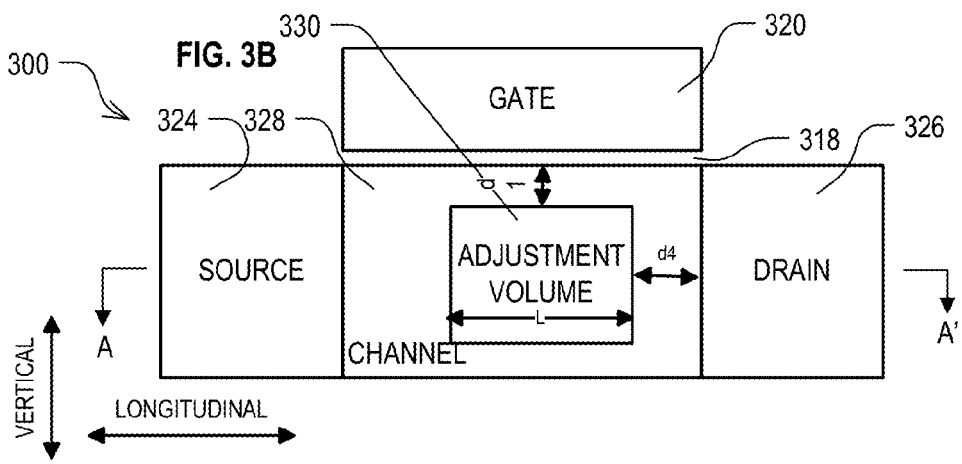

FIGS. 3C, 3A and 3B (collectively FIG. 3) illustrate a simplified FinFET transistor 300, incorporating aspects of the invention, on an SOI wafer (not shown). FIG. 3C is a cross-sectional view of transistor 300 corresponding to the view of transistor 100 in FIG. 1C; FIG. 3A is a top view of transistor 300 corresponding to the view of transistor 100 in FIG. 1A; and FIG. 3B is a side view of transistor 300 corresponding to the view of transistor 100 in FIG. 1B. In FIG. 3, an undoped silicon fin (body 310) has longitudinally separated source and drain volumes 324 and 326 for the transistor 300. A channel region 328 separates the source and drain volumes 324 and 326 longitudinally. A gate dielectric 318 overlies and wraps around the silicon body 310, and a gate conductor 320 overlies and wraps around the gate dielectric 318. Thus the gate dielectric 318 is disposed between the gate conductor 320 and the channel volume 328. Other aspects and variations for the elements of transistor 300 are the same as those set forth above for transistor 100.

Transistor 300 differs from transistor 100, however, in that the fin 310 includes within its channel volume an adjustment volume 330. The adjustment volume 330 has a different electrical conductivity from the surrounding material in the fin 310, at least while the transistor 300 is in the off-state. Preferably, at least while the transistor 300 is in the off-state, the material in the adjustment volume at each longitudinal position has an electrical conductivity which differs from that of the adjacent body material at the same longitudinal position. As seen best in FIG. 3C, the cross-section of adjustment volume 330 is spaced behind the surfaces on each side of the fin 310 over which the gate conductor 320 is formed. Thus the adjustment volume 330 is spaced below a top surface 332 by a distance d1, spaced to the right of left surface 334 by a distance d2, and spaced to the left of right surface 336 by a distance d3. The adjustment volume 330 in FIG. 3 is also shown spaced from the bottom surface 338 of the structure, where no gate conductor is present, but this is not necessary in all embodiments. As used herein, "surfaces" need not be planar, though typically they are continuous. Also as used herein, a position "behind" a surface of a body is a position inside the body. The term does not depend on device orientation, so if viewed from above for example, "behind" a surface means "below" the surface. Still further, whereas the left and right surfaces 334 and 336 are sometimes referred to herein as "laterally opposite" or "laterally opposing" each other, it will be appreciated that surfaces with that description are not required to be vertical. They may be diagonal, for example, such as in FIG. 7.

In one embodiment, the adjustment volume has less conductivity than the surrounding fin volume in the off-state. Preferably the adjustment volume is a dielectric, or an air gap. The distances d1, d2 and d3 are chosen to be small enough that the adjustment volume blocks most leakage current flow through the weakly controlled cross-sectional center of the fin 310 when the transistor 300 is in the off-state, while still allowing plenty of current flow around the adjustment volume when the transistor 300 is in the on-state. The exact sizes of distances d1, d2 and d3 will depend on the particular application.

Figure 4:
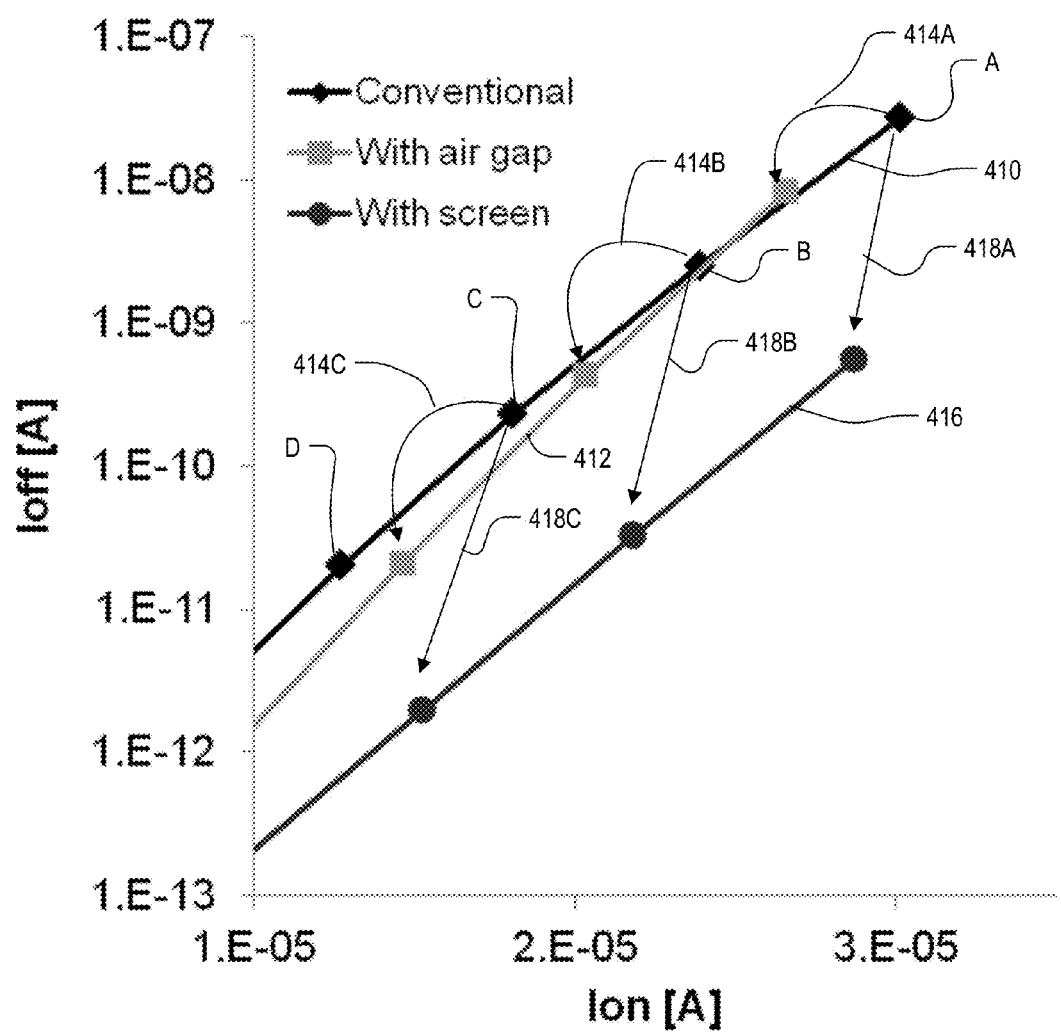
FIG. 4 is a plot illustrating by simulation how Ion and Ioff change with the introduction of the adjustment volume of FIG. 3, for a number of different example configurations.

FIG. 4 is a plot illustrating by simulation how Ion and Ioff change with the introduction of adjustment volume 330, for a number of different example configurations. Line 410 plots values for Ion and Ioff for an example conventional FinFET having no adjustment volume, for four different gate work functions A, B, C and D. A transistor with gate work function A or B would likely be targeted for high performance applications, since they achieve higher Ion at the expense of higher Ioff. A transistor with gate work function C or D would likely be targeted for low power applications, since they achieve lower Ioff at the expense of lower Ion. It can be seen that for gate work function A, Ion is about $3\times10^{-5}$ A and Ioff is about $2.5\times10^{-8}$ A, for an Ion/Ioff ratio of about 1200. For gate work function B, Ion is about $2.4\times10^{-5}$ A and Ioff is about $2.5\times10^{-9}$ A, for an Ion/Ioff ratio of about 9,600. For gate work function C, Ion is about $1.8\times10^{-5}$ A and Ioff is about $2\times10^{-10}$ A, for an Ion/Ioff ratio of about 90,000. It is desirable to shift this curve to the right and/or downward, which would indicate either a gain in Ion at a fixed Ioff or a drop in Ioff at a fixed Ion or a combination of both.

Line 412 plots values for Ion and Ioff for the same example FinFET, but with an air gap adjustment volume inserted, for the gate work functions A, B and C. Arrows 414A, 414B and 414C (collectively 414) indicate how the Ion and Ioff values have changed for the three gate work functions A, B and C. It can be seen that while in all three cases both Ion and Ioff have been reduced, the curve 412 remains roughly consistent with curve 410. Nevertheless, a small improvement is shown for chips targeted for low-power applications.

While an air gap adjustment volume provides some benefit for low power chips, it would be desirable to provide additional benefit for a wide range of applications.

Figure 5A:
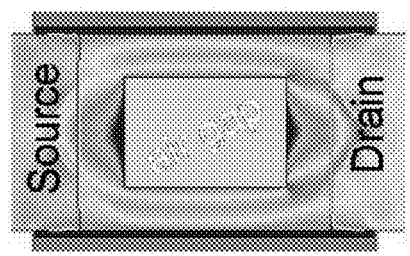
FIGS. 5A and 5B, sometimes referred to collectively herein as FIG. 5, are top views of the transistor 300, taken from a horizontal 2D slice through the middle of the fin height, and in which the adjustment volume of FIG. 3 is an air gap.

FIG. 5A is a top view of the transistor 300, taken from a horizontal 2D slice through the middle of the fin height, and in which the adjustment volume 330 is an air gap. The drawing illustrates by simulation the longitudinal and transverse distribution of current densities in the fin while the transistor is in the off-state. As in FIG. 2A, current density is indicated by color, with colors toward the blue end of the spectrum indicating lower current densities and colors toward the red end of the spectrum indicating higher current densities. It can be seen that while leakage currents have been blocked through the air gap in the cross-sectional center of the fin 310, they continue to flow round the outer regions of the fin. The density of the leakage current is smaller than in the transistor 100 (compare to FIG. 2B), but the current density in the on-state can be expected to be smaller as well due to the reduced cross-sectional area through which current can flow.

Returning to FIG. 4, line 416 plots values for Ion and Ioff for the same example FinFET 300, for the gate work functions A, B and C, but this time with an electrically conductive screen material in the adjustment volume. The screen material can be for example a metal, or a heavily doped semiconductor. Arrows 418A, 418B and 418C (collectively 418) indicate how the Ion and Ioff values have changed for the three gate work functions A, B and C. It can be seen that in all three cases, while Ion reduces, Ioff reduces substantially. The curve 416 is therefore shifted markedly downward. In the examples illustrated, the conductive screen can increase Ion by 50% at a fixed Ioff of $10^{-10}$ A. Alternatively, it can increase switching speed by an amount on the order of 25%, or reduce leakage current by a factor on the order of 40, or a combination of both.

Figure 6A:
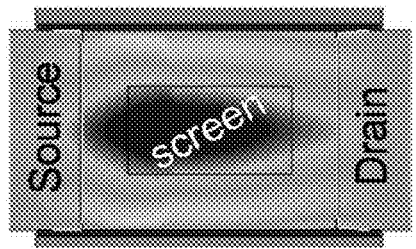
FIGS. 6A and 6B, sometimes referred to collectively herein as FIG. 6, are top views of the transistor 300, taken from a horizontal 2D slice through the middle of the fin height, and in which the adjustment volume of FIG. 3 is a conductive screen material.

FIG. 6A is a top view of the transistor 300, taken from a horizontal 2D slice through the middle of the fin height, and in which the adjustment volume 330 is an electrically conductive material. As with FIG. 5A, FIG. 6A illustrates by simulation the longitudinal and transverse distribution of current densities in the fin while the transistor is in the off-state. Current density is indicated by color, with colors toward the blue end of the spectrum indicating lower current densities and colors toward the red end of the spectrum indicating higher current densities. It can be seen that while small leakage currents continue to flow round the outer regions of the fin, they have been effectively blocked through the conductive screen in the cross-sectional center of the fin 310.

Figure 2C:
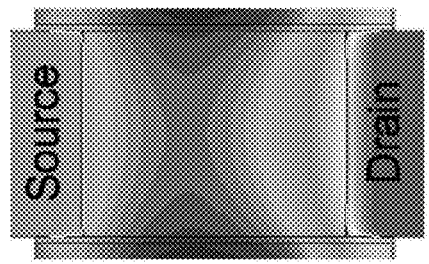

It is believed that whereas the air gap of the FIG. 5A embodiment operates by physically blocking current flow through the center of the fin, the conductive screen of FIG. 6A operates instead by terminating the off-state electrostatic drain potential field. FIG. 2C is a top view of the transistor 300, taken from a horizontal 2D slice through the middle of the fin height, and with no material difference in the adjustment volume 330. Thus the structure is the same as that of FIG. 2B. Whereas FIG. 2B illustrates current density, FIG. 2C illustrates by simulation the longitudinal and transverse distribution of electrostatic potential in the fin while the transistor is in the off-state. Potential is indicated by color, with colors toward the blue end of the spectrum indicating lower values (lower magnitude potentials) and colors toward the red end of the spectrum indicating higher values (higher magnitude potentials). It can be seen that in the conventional Fin-FET, the drain field penetrates through the channel and lowers the source junction barrier. This effect is known as drain-induced barrier lowering (DIBL), and contributes to the leakage current seen in FIG. 2B.

Figure 5B:

FIG. 5B is a top view of the transistor 300, taken from a horizontal 2D slice through the middle of the fin height, and in which the adjustment volume 330 is an air gap. The structure corresponds to that of FIG. 5A. Using the same color scale as in FIG. 2C, FIG. 5B illustrates by simulation the longitudinal and transverse distribution of electrostatic potential in the fin while the transistor is in the off-state. It can be seen that in a FinFET with a dielectric material in the adjustment volume, the drain field penetrates into the adjustment volume and fails to significantly affect DIBL. This would explain why significant leakage current continues to flow as illustrated in FIG. 5A.

Figure 6B:
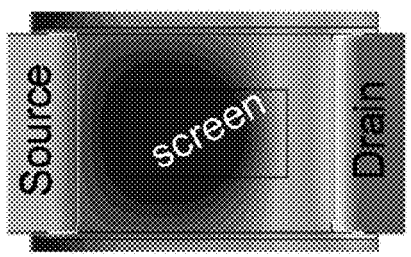

FIG. 6B is a top view of the transistor 300, taken from a horizontal 2D slice through the middle of the fin height, and in which the adjustment volume 330 is an electrical conductor. The structure corresponds to that of FIG. 6A. Using the same color scale as in FIG. 2C, FIG. 6B illustrates by simulation the longitudinal and transverse distribution of electrostatic potential in the fin while the transistor is in the off-state. It can be seen that in a FinFET with a conductive material in the adjustment volume, the drain potential sharply reduces in magnitude at the drain-side vertical surface of the adjustment volume. DIBL is thus greatly reduced, explaining why leakage current is so greatly reduced as illustrated in FIG. 6A. In addition, it can be appreciated that in the on-state, current flow is not significantly reduced because current flows through electrical conductors.

Design Considerations

Aspects of the invention involve a different or modified material in an adjustment volume within the channel volume of a transistor. In an embodiment like that of FIG. 5A, the adjustment volume material can be air or a dielectric, in which case it can provide the benefits described above and illustrated in FIG. 4, line 412, primarily but not exclusively for low power devices. While these benefits appear to be maximized for adjustment volume materials which have very low conductivity (at least in the off-state), it is believed that some benefits can be achieved for adjustment volume materials whose conductivity in the off-state is to any degree smaller than that of the surrounding fin material. Other example materials with lower conductivity that can be used include typical dielectrics like silicon dioxide, or low-k dielectrics, or high-k dielectrics, or a semiconductor with wider bandgap that has an appropriate conduction band offset for the NMOSFETs or appropriate valence band offset for the PMOSFETs such that the carriers are pushed away from the adjustment volume towards the gate.

Alternatively, in an embodiment like that of FIG. 6A, the adjustment volume material can be an electrical conductor, in which case it can provide the benefits described above and illustrated in FIG. 4, line 416. While these benefits appear to be maximized for adjustment volume materials which have very high conductivity (at least in the off-state), it is believed that some benefits can be achieved for adjustment volume materials whose conductivity in the off-state is to any degree higher than that of the surrounding fin material. Example materials with higher conductivity that can be used include metals such as cobalt, silver or aluminum, although these may be limited to use in low temperature processes in order to avoid reacting or intermixing with the surrounding silicon. Other materials include nitrides such as titanium nitride or tantalum nitride. Another material that can be used is simply a heavily doped portion of the fin. Note that as previously mentioned, part of the advantage obtained from the use of a conductive material in the adjustment volume, is that as a conductor, on-state conduction is maximized or unaffected because current can flow through it. This implies that if the adjustment volume material is a heavily doped portion of the fin, the doping should be of the same doping type as the longitudinally-adjacent material (or the longitudinally-adjacent material should be undoped).

FIG. 3C, described above, illustrates a cross-sectional position within a fin at which the adjustment volume may be located. The illustration is for a fin with a rectangular cross-section, an adjustment volume which is an idealized rectangular parallelepiped, and a gate conductor 320 which wraps around three sides of the fin. In this case the three distances d1, d2 and d3 are easily defined as illustrated in the drawing. At least in an embodiment in which the adjustment volume material is more conductive in the off-state than the surrounding fin material, these distances preferably should be small enough to terminate or block most of the drain field when the transistor is in the off-state, but large enough to permit good conductivity in the channel when the transistor is in the on-state. Good on-state conductivity limits the minimum distances because of effects such as quantum separation and carrier scattering in very thin channels. As an example, the distances d1, d2 and d3 may each be on the order of 3 nm.

FIGS. 3A and 3B also show a distance d4, which is the longitudinal distance by which the drain-side surface of the adjustment volume is set back from the drain volume 326. Distance d4 should be large enough to electrically separate the adjustment volume from the source and from the drain, so that the adjustment volume has the ability to carry a potential that differs from that of the source and/or drain. If distance d4 is too large, however, then the adjustment volume would be so small that it is difficult to manufacture. So, for practical considerations, distance d4 should be several nanometers, in the range from 1 nm to 5 nm.

FIGS. 3A and 3B also show a length L, which is the length in the longitudinal direction of the adjustment volume 326. Length L should be long enough to terminate the drain field effectively. As an example, length L should be at least about 2 nm. It can also be much longer, which may simplify fabrication.

Note that the three distances d1, d2 and d3 need not be equal to each other in all embodiments. Note also that in a particular embodiment, the gate may not wrap around all three sides of the fin as shown in FIG. 3C. As used herein, the gate is said to "face" a given side of the fin if it generally parallels the given side, is separated from the given side with a dielectric material in between, and influences the conductivity of the fin material depending on whether an on-state or off-state voltage is applied to the gate conductor. In some embodiments the gate may face only two sides of the fin, or in some embodiments, such as an ETSOI, the gate faces only one side of the "fin" (i.e. the top surface of the channel region). In these cases the same considerations as set forth above with respect to distances d1, d2 and d3 would continue to apply, but only for the sides of the fin which face a portion of the gate conductor. In some embodiments one or more of the distances, to a side of the fin which lacks a facing gate conductor, may even be zero.

The various distances d1, d2, d3 and also d4 can be chosen in dependence upon the goals of the particular design. Referring to the plot of FIG. 4, it will be appreciated that line 412 or 416 (as the case may be) will move to different positions in dependence on such distances, as well as in dependence upon transistor size, cross-sectional fin shape, and all the materials involved. In all situations an optimum set of distances can be found which best achieve the particular design goals, optionally with consideration of manufacturing expedience.

Figure 7:
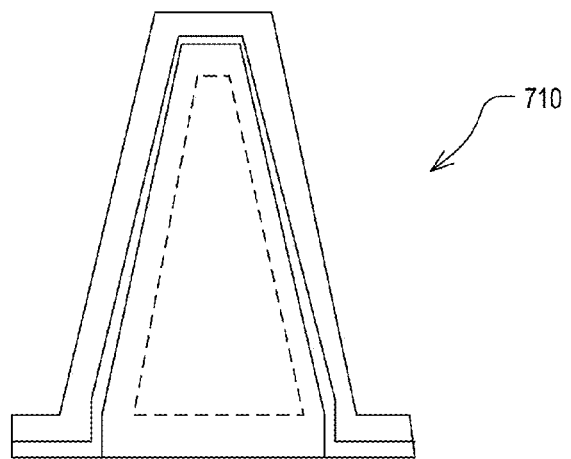
FIGS. 7 and 8 illustrate alternative fin shapes.
Figure 8:
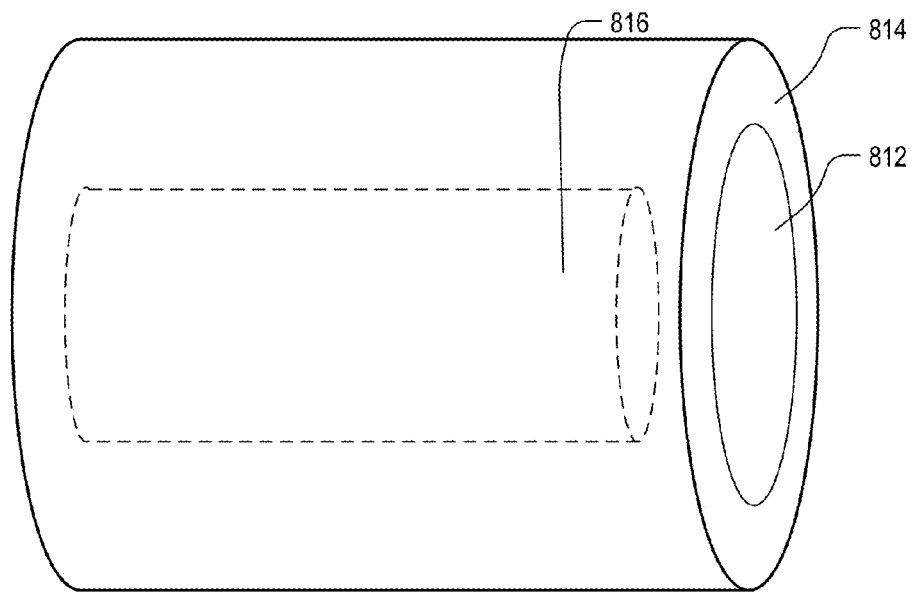

Also, note that whereas the illustration of FIG. 3C is for a fin with a rectangular cross-section, an adjustment volume which is an idealized rectangular parallelepiped, and a gate conductor 320 which wraps around three sides of the fin, none of those features need necessarily obtain in different embodiments. FIG. 7, for example, illustrates a fin 710 having a triangular cross-section. An adjustment volume 712 is shown with dotted outlines. FIG. 8 illustrates a nano-wire 810 in which the fin 812 is cylindrical and is wrapped on all sides cross-sectionally by a gate stack 814. An adjustment volume 816 is shown with dotted outlines. These structures, as well as many others, can also benefit from the use of an adjustment volume of different off-state conductivity than the surrounding fin material as described herein. In all cases the distance by which the adjustment volume is set back behind a surface of the fin will depend on the particular structure, and both those distances and the adjustment material conductivity can be optimized for desired improvement in switching speed, leakage current, and/or Ion/Ioff. In general, the use of such an adjustment volume enables significant improvement in these quantities, while retaining larger fin widths as needed for manufacturability In addition, the adjustment volume material can be chosen also to introduce desired stresses for stress engineering purposes. In general, for semiconductors, electrons benefit from longitudinal tensile stress whereas holes benefit from longitudinal compressive stress. Typically the adjustment volume mainly induces longitudinal stress. Therefore for an N-channel transistor, where the adjustment volume material is crystalline, its crystal type should be the same as the channel crystal type but it should have a lattice size which is somewhat larger than the channel material. For example, the fin material in the channel may be silicon and the adjustment volume material may be SiGe. This will introduce longitudinal tensile stress into the surrounding body material in the channel. Conversely, for a P-channel transistor, where the adjustment volume material is crystalline, its crystal type should be the same as the channel crystal type but it should have a lattice size which is somewhat smaller than the channel material. For example, the fin material in the channel may be SiGe and the adjustment volume material may be silicon. This will introduce longitudinal compressive stress into the surrounding body material in the channel. Other materials and variations will be apparent to the reader.

Fabrication Method

FIGS. 9A-9I (collectively FIG. 9) illustrate a sequence of steps by which a desired adjustment volume material can be formed inside a fin as illustrated in FIG. 3. It is to be understood and appreciated that the process steps and structures described herein do not describe a complete process flow for the manufacture of an integrated circuit. The invention may be practiced in conjunction with various integrated circuit fabrication techniques that are conventionally used in the art, or that are hereafter developed, and only so much of the commonly practiced process steps are included herein as are necessary to provide an understanding of the invention.

Each FIG. 9A-9I shows three views: end, top and side, corresponding to the same three views shown in FIGS. 3C, 3A and 3B, respectively. The fin material in the embodiment of FIG. 9 is silicon, though in other embodiments it can be other types of semiconductor such as but not limited to germanium (Ge), a silicon germanium alloy ($Si_xGe_y$), gallium arsenide (GaAs), InSb, GaP, GaSb, as well as carbon nanotubes. Also in the embodiment of FIG. 9 the fin is an intrinsic (i.e., undoped) silicon film. In other embodiments, the fin is doped to a p type or n type conductivity with a concentration level between $10^{16}$-$10^{19}$ atoms/$cm^3$. Also in the embodiment of FIG. 9, the adjustment volume material is heavily doped silicon.

In FIG. 9A, a silicon fin 910 is formed on an SOI wafer (not shown). The top view of FIG. 9A shows sight lines E-E' showing where the end view is taken, and sight lines S-S' showing where the side view is taken. The side view shows sight lines T-T' showing where the top view is taken. The sight lines are omitted from many of the subsequent drawings for clarity of illustrations. The silicon fin 910 can be formed by any method, such as by deposition of silicon followed by lithographic etching. The fin 910 extends vertically from the wafer to a height above the wafer surface roughly equal to the desired height of the fin. For example, the height of fin 910 may be 30 nm.

In FIG. 9B, a sacrificial gate stack 912 is formed on all three exposed sides if the silicon fin 910. Typically sacrificial gate stack 912 includes a thin gate dielectric such as an oxide wrapping the fin, and a gate conductor such as polysilicon formed thereon, again on all three sides. Layer 912 is referred to as being sacrificial because, consistently with some conventional processes, downstream it will be removed and replaced with other materials. In this sense layer 912 acts merely as a placeholder.

In FIG. 9C, the wafer is coated with an oxide 914, and then etched back to expose the top surface of the sacrificial layer 912. Since the top surface of the layer 912 is higher than the height of the silicon fin 910, the longitudinal portions of the fin which will become the source/drain regions 918 remain covered by a layer of oxide 914. In FIG. 9D the sacrificial layer 912 is removed, for example by selective etching. This step exposes the silicon fin 910 top surface, and also opens holes 916 on the two laterally facing sides of the fin. The fin 910 is now exposed on all three sides (top and the two laterally facing sides), but only within the longitudinal extent of the channel region.

In FIG. 9E, silicon nitride is deposited over the entire wafer and then anisotropically etched back to again expose the top surface of the fin 910. SiN sidewall spacers 920 remain on all the vertical surfaces in the structure, including all the inside sidewalls of the oxide 914 and the two laterally facing sides of the fin 910. Importantly, this includes the sidewalls 920A and 920B of the oxide 914 which are disposed at the two longitudinally opposite ends of the channel volume of the fin 910. The spacers may have a thickness on the order of _nm.

Next, also as shown in FIG. 9E, a dopant such as B or As is implanted or diffused into the exposed portion of the silicon to a sufficiently heavy concentration to render the silicon electrically conductive within the doped volume. The dopant type should be the opposite to the dopants in the source and drain. For example, the dopant may be arsenic for the PMOS-FET, and the concentration within the doped volume may be in the range $10^{19}$ $cm^{-3}$ to $10^{21}$ $cm^{-3}$. The heavily doped volume does not extend into the portions of the fin below the SiN spacers 920A and 920B. Also, though in one embodiment the implantation energy is such that the dopant atoms are injected into the fin 910 all the way down to the wafer surface level, that is not always necessary and in the embodiment of FIG. 9 the dopant atoms do not reach so deeply. The heavily doped volume therefore is spaced from the level of the wafer surface by some small distance.

In FIG. 9F, the SiN layer is removed, leaving a heavily doped volume shown in the drawing as dotted region 922. It can be seen that doped volume 922 is spaced from the wafer surface level by an undoped silicon volume 924, and also spaced longitudinally from the source/drain volumes 918 roughly by the thickness of the SiN sidewall spacers. Atop the undoped volume 924, though, the doped volume 922 extends all the way to the top surface and the two laterally facing surfaces of the fin 910.

Figure 9G:
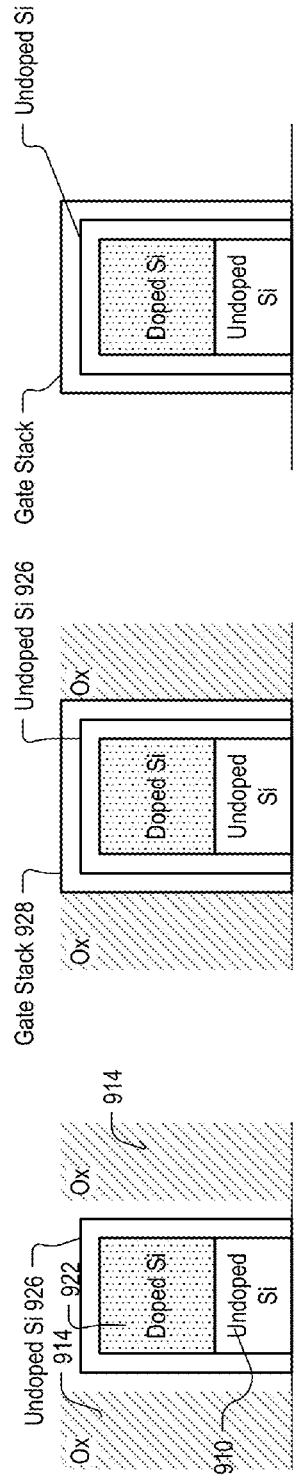
Figure 9H:
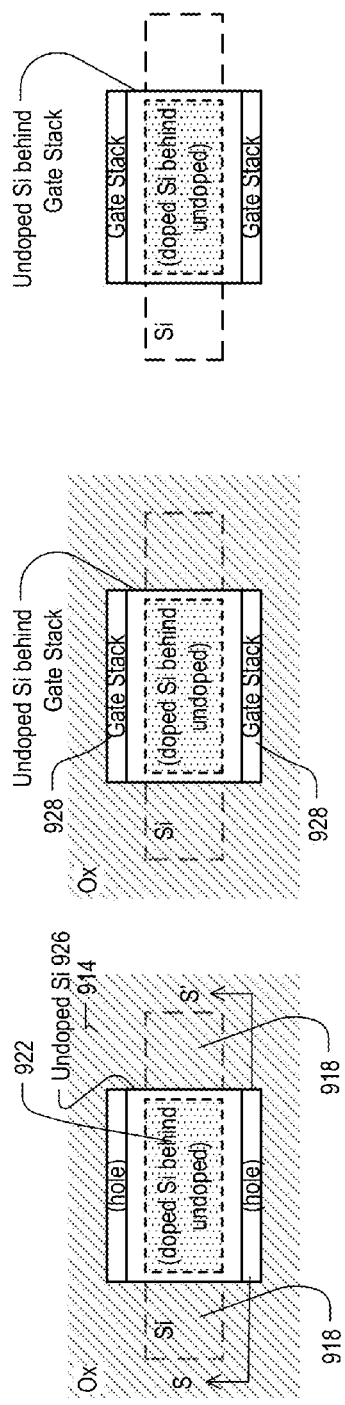
Figure 9I:
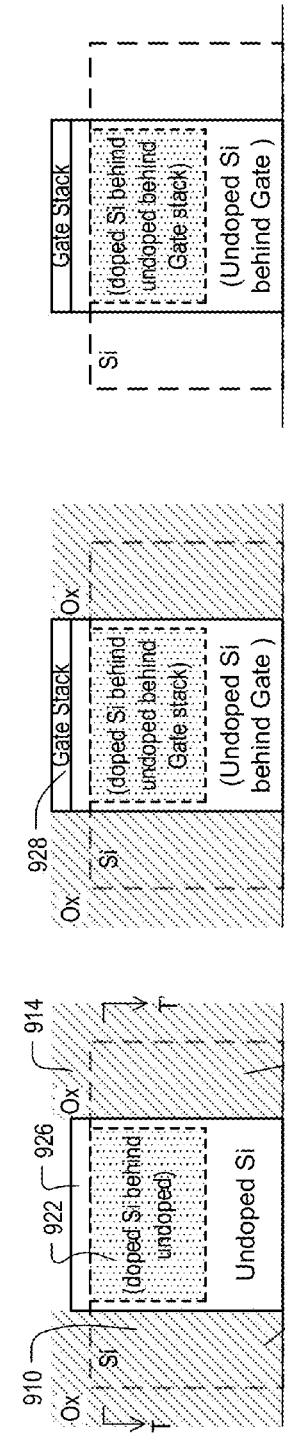

In FIG. 9G, a new layer 926 of undoped silicon is grown epitaxially on all exposed surfaces of the fin 910. It can be seen that the heavily doped volume 922 is not only spaced from the source/drain volumes 918 as previously mentioned, but is also spaced behind all three surfaces (top and two laterally opposing side surfaces) of the fin. In FIG. 9H the gate stack 928 is formed by conventional means over all exposed surfaces of the fin, including the top and the two laterally opposing side surfaces. In FIG. 9I the oxide 914 is removed by conventional means and processing continues with the remainder of the steps involved in fabricating the integrated circuit chips. This includes doping the source/drain volumes with donor or acceptor dopant atoms in order to make the transistor an N-type or P-type transistor, respectively.

Alternative Fabrication Method

FIGS. 10A-10F (collectively FIG. 10) illustrate an alternative sequence of steps by which a desired adjustment volume material can be formed inside a fin. A structure resulting from this alternative process is shown and described with respect to FIG. 10F. Again, only so much of the commonly practiced process steps from a typical fabrication process are included herein as are necessary to provide an understanding of the invention. All of the alternatives and caveats mentioned above with respect to FIG. 9 are incorporated by reference with respect to the FIG. 10 process.

Each FIG. 10A-10F shows three views: end, top and side. The fin material in the embodiment of FIG. 10 is intrinsic silicon, and the adjustment volume material is heavily doped silicon, with the same doping type as the source and drain. Alternatively, the adjustment volume material can be a material with a wider bandgap than that of the channel material. In yet another alternative, the adjustment volume can be made of multiple sub-layers, some of which may be conductive, some dielectric, some semiconductor, some with a bandgap wider than that of the channel material, and so on. Other variations will be apparent to the reader.

Figure 10A:
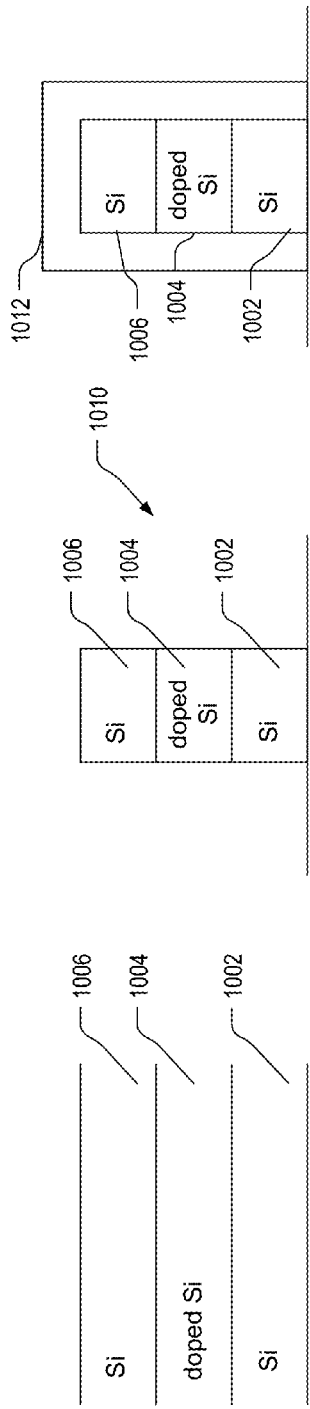

Initially, an SOI wafer (not shown) is provided with a silicon surface layer 1002. The layer 1002 covers laterally at least the region in which the transistor is being formed, and may in some embodiments cover the entire wafer. A heavily doped silicon layer 1004 is grown epitaxially above the silicon layer 1002, and another undoped silicon layer 1006 is grown above layer 1004. The resulting structure is shown in FIG. 10A.

Figure 10B:
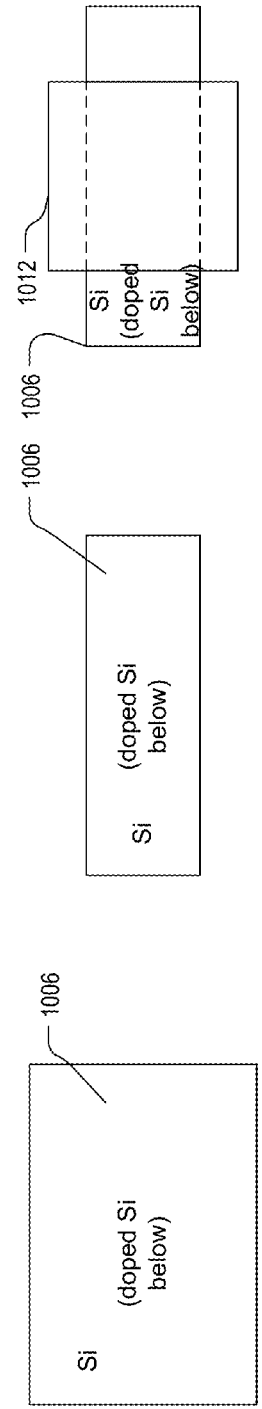

In FIG. 10B, the fin 1010 is formed by etching ridges, such as by methods used in King U.S. Pat. No. 7,190,050, to form a so-called "corrugated" substrate. The drawings in the King patent show how the structure would appear, in various embodiments. The fins may then be cut lengthwise at this point as well, or that step may be postponed until later. Cutting methods, too, are discussed in the King patent. At this point each fin has its final fin width, and comprises a vertical Si/doped-Si/Si stack of materials. The doped Si layer 1004 extends all the way across the fin transversely. Thus some or all of the ridges illustrated in the drawings in the King patent would comprise a vertical Si/doped-Si/Si stack of materials. King U.S. Pat. No. 7,190,050 is incorporated herein by reference, including all of the variations described therein. Some pertinent parts of the King patent are reproduced in the Appendix and the drawings.

Figure 10C:
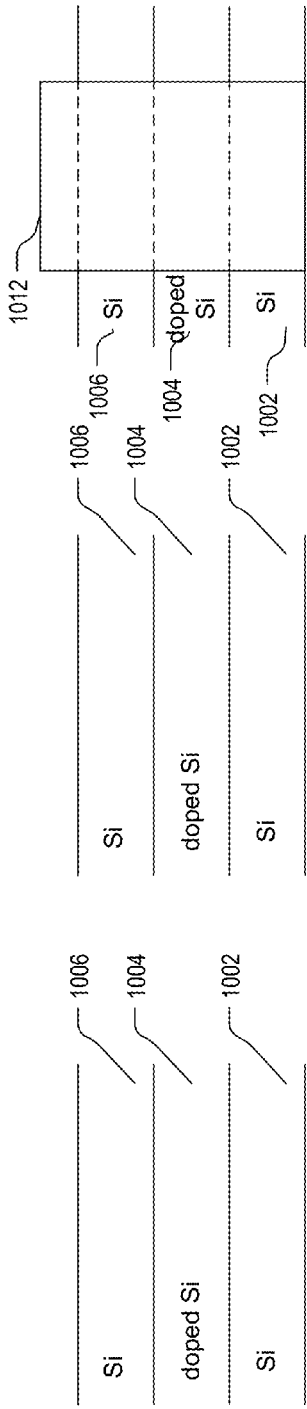

In FIG. 10C, a sacrificial gate stack 1012 is formed on all three exposed sides if the fin 1010. Typically sacrificial gate stack 1012 includes a thin gate dielectric such as an oxide wrapping the fin, and a gate conductor such as polysilicon formed thereon, again on all three sides. Layer 1012 is referred to as being sacrificial because, consistently with some conventional processes, downstream it will be removed and replaced with other materials. In this sense layer 1012 acts merely as a placeholder.

In FIG. 10D, the fins are etched back longitudinally. Etching continues even beyond the longitudinal ends of the gate stack 1012, so the resulting fin material is recessed below the gate stack on both longitudinal ends. This type of under-etching step occurs in some conventional processes as well, but the extent of under-etching is greater in FIG. 10D.

In FIG. 10E, undoped silicon is grown epitaxially on the exposed Si sidewalls of the fin, which in the case of FIG. 10E, are only the longitudinal end surfaces of the fin materials. This forms fin segments 1014 on both sides of the doped silicon layer 1004 longitudinally, separating the doped silicon layer 1004 longitudinally from the source and drain materials and thereby electrically separating the adjustment "volume" of the doped silicon material 1004 from the source/drain regions, at least when the transistor is in the off-state.

In FIG. 10F, the deposition of silicon continues, but source/drain dopant is now mixed into the growth atmosphere. The source/drain regions 1016 are thus formed. Note that in FIG. 10F the doped source and drain regions are shown as extending partially under the gate stack. In another embodiment, doping might not begin until after the undoped silicon fin material is grown to positions equal to or beyond the longitudinal edges of the gate stack 1012. Additionally, other impurities may be mixed into the growth atmosphere during source/drain formation, such as germanium or other materials for stress engineering.

Note that in the embodiment of FIG. 10, the adjustment volume 1004 is separated from the top and bottom of the fin and also separated from the source and drain regions longitudinally. But it extends across the entire transverse width of the fin. This can be true in nanowire embodiments of the invention as well. In another embodiment the adjustment volume 1004 is also spaced from the gate stack on the transversely opposite sides of the fin. This can be accomplished by, between steps 10B and 10C (i.e. after forming the ridges and before forming the gate stack), growing additional silicon on the transversely opposite sidewalls of the ridges. This widens the fin somewhat, which improves mechanical stability, but does not degrade Ioff due to the presence of the adjustment volume. The growth of additional silicon on the transversely opposite sides of the ridges can be accomplished in a conventional manner, such as by growing additional silicon on all exposed silicon surfaces on the wafer, and then anisotropically etching back the grown silicon to remove all but the portions grown on vertical sidewalls. Alternatively, instead of growing the additional semiconductor material before forming the gate stack, it can be grown later. In many modern fabrication processes the gate stack formed initially is sacrificial, and later in the process the gate stack is removed and re-formed with different materials. Thus in this alternative method the additional semiconductor material is formed on the transversely opposite sides of the fin after removal of the sacrificial material, and before re-forming the gate stack with the different materials. Other variations will be apparent to the reader.

Additionally, whereas in the embodiment described above with respect to FIG. 10 the additional fin segments 1014 grown initially on both longitudinal end faces of the channel are undoped, it will be appreciated that additional fin segments 1014 can be constructed from any material or materials that are less conductive than the source and drain materials, respectively, at least when the transistor is in the off state. For example the segments 1014 can be doped, more lightly than the adjustment layer material, with a doping type opposite that of the source and drain. The material of the segments 1014 should be chosen such that the segments 1014 isolate the adjustment layer material sufficiently from the source and drain to permit the adjustment layer material to have a potential different from the source and/or drain, when the transistor is in the off state. As used herein, where a material A is said to be more lightly doped than a material B, this includes structures in which material A is undoped. Similarly, as used herein, where a material A is said to be more heavily doped than a material B, this includes structures in which material B is undoped.

Corrugated Wafer

As mentioned above with respect to FIGS. 10A and 10B, fabrication of transistors incorporating adjustment volumes as described herein can be facilitated by providing a starting "corrugated" wafer in which ridges are pre-formed. This section describes techniques that can be used to prepare such corrugated wafers.

Initially a substrate is provided, which may be bulk silicon or silicon on insulator (SOI) for example. The three layers 1002, 1004 and 1006 as shown in FIG. 10A then can be formed for example by growing the doped Si layer 1004 epitaxially on the top surface of the provided substrate, which itself becomes the lower silicon layer 1002 of the fins. The top silicon layer 1006 is then formed by epitaxial growth on the doped silicon layer 1004. The growth of all the ridge layers can preferably be performed in a single epitaxial growth process in which the growth atmosphere is controlled to include more dopant during the growth of layer 1004 than during the growth of other layers 1006. Alternatively, the existing silicon of the provided substrate can be retained to form both the lower and upper silicon layers 1002 and 1006, and the doped silicon layer 1004 can be formed by a high-energy ion implant operation, in which the implanted dopant ions all penetrate to the desired depth below the surface, followed by an anneal to repair the silicon. However, the epitaxial growth method is preferred because sharper transitions can be formed from one layer to the next.

Figure 11:
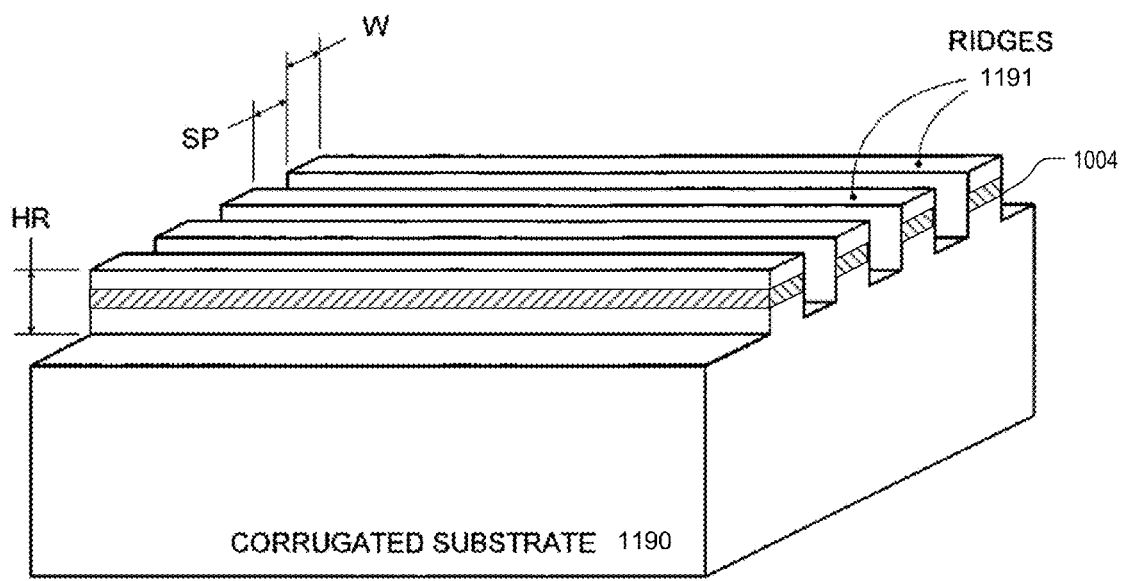
FIG. 11 shows an exemplary corrugated substrate incorporating features of the invention.

FIG. 11 shows an exemplary corrugated substrate 1190 that includes a set of ridges 1191. Each of ridges 1191 has a height HR, a width W, and a spacing between ridges SP. Doped silicon layer 1004 can be seen in each of the ridges. Because ridges 1191 are made prior to any specific device patterning, various processing techniques can be used to generate ridges 1191 with a high degree of accuracy and regularity. For example, imprint lithography is a technique in which a master stencil is precisely patterned using electron-beam lithography. The master stencil is then used to pattern wafers (e.g., by imprinting a resist pattern onto a wafer), thereby enabling the formation of precise, sub-wavelength features on those wafers. Imprint lithography can allow ridges 1191 to be created with extremely precise and regular dimensions, thereby avoiding the inherent inaccuracies associated with optical lithography. Other techniques for forming ridges 1191 (such as spacer lithography described in Y.-K. Choi et al., "A spacer patterning technology for nanoscale CMOS," IEEE Transactions on Electron Devices, Vol. 49, No. 3, pp. 436-441 (2002), in which vertical thin films are created along the sidewalls of sacrificial features, which are subsequently etched away) will be readily apparent.

By creating ridges 1191 as standalone structures prior to discrete device definition, ridges 1191 can be formed with a high degree of precision (.+-.15% tolerances and better) using techniques that would not necessarily be suitable for general IC production (e.g., imprint lithography and spacer lithography). The pre-formed corrugated wafer is then provided for subsequent IC manufacturing, for example as described above with respect to FIGS. 10C-10F. In one embodiment, the corrugated wafer can be provided with the adjustment layer material 1004 extending laterally all the way to the opposing side surfaces of the ridges, as shown in FIG. 11. In another embodiment, additional undoped silicon is grown on the transversely opposite sides of the ridges before the wafer is provided for subsequent IC manufacturing. As set forth above with respect to FIG. 10, this can be accomplished by growing additional silicon on all exposed silicon surfaces on the wafer, and then anisotropically etching back the grown silicon to remove all but the portions grown on vertical sidewalls.

In yet another embodiment, with or without the additional undoped silicon on the transversely opposite sides of the ridges, the corrugated wafer can also be pre-coated with gate stack material 1012 (final or sacrificial), and provided in that form for subsequent IC manufacturing. In this embodiment, the subsequent IC manufacturing may achieve the starting point shown in FIG. 10C by etching the gate stack material to leave gates in only desired positions.

In one embodiment, a semiconductor wafer can be fully patterned with ridges, thereby allowing subsequent formation of transistor(s) at any desired location on the wafer. For example, FIG. 12A shows a top view of a wafer 1290-A that includes an array of ridges 1291-A running across almost the entire wafer surface. Ridges 1291-A are substantially similar to ridges 1191 described previously, and have a predetermined height (HR in FIG. 11), width (W in FIG. 11), spacing (SP in FIG. 11), and composition (e.g., silicon, silicon-germanium, silicon on silicon-germanium, or carbon nanotubes, among others). By forming ridges at the wafer level, IC production costs are minimally impacted, since this type of simple bulk patterning is much less complex (and therefore much less expensive) than the localized feature formation performed during subsequent IC processing. Note that in one embodiment, wafer 1291-A can include ridge isolation material between ridges 1291-A.

Figure 12B:
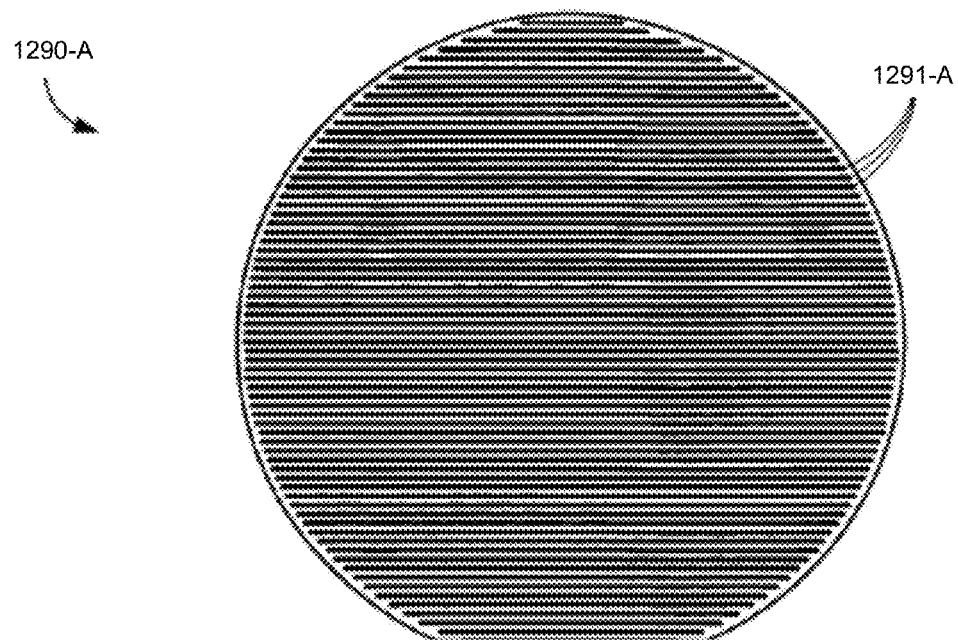
Figure 12B:
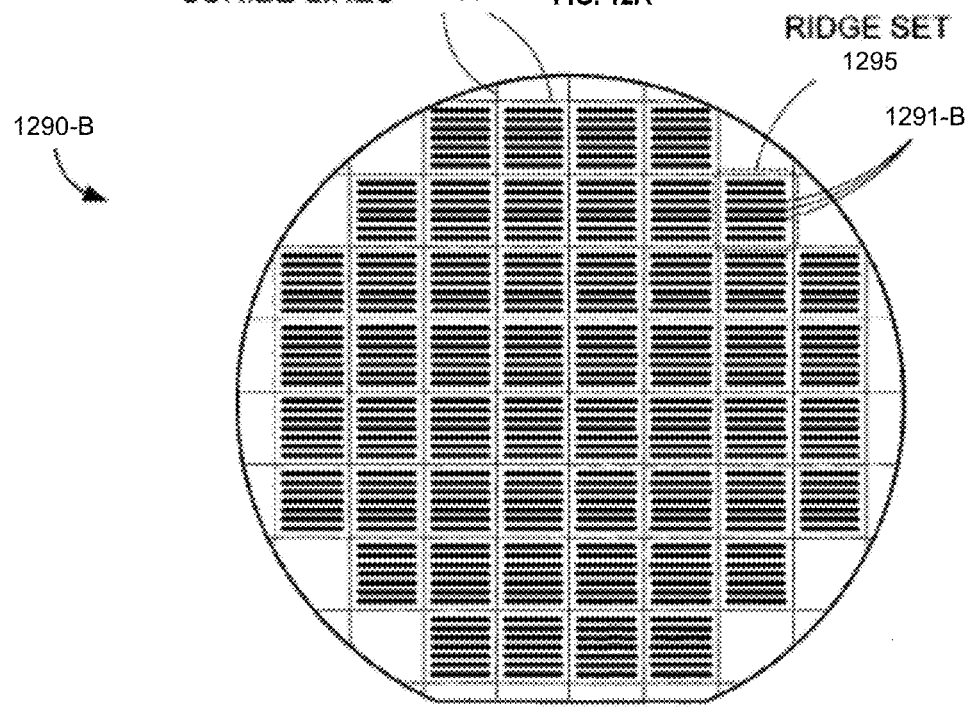

Note further that in various other embodiments, a corrugated substrate can include localized groupings of parallel ridges, rather than the continuous ridges 1291-A that span the entire wafer surface as shown in FIG. 12A. For example, FIG. 12B shows another embodiment of a corrugated substrate 1290-B that includes localized ridge sets 1295. Each localized ridge set includes ridges 1291-B that exhibit the same dimensional and physical consistency as described with respect to ridges 1291-A shown in FIG. 12A, but are discontinuous across scribe lines 1299, which can simplify subsequent IC formation and wafer dicing operations. Therefore, each die location on corrugated substrate 1290-B (i.e., each location where an IC is to be formed) includes a separate ridge set 1295. As described with respect to FIG. 12A, ridge sets 1295 can also include ridge isolation material between ridges 1291-B. Note that in some embodiments, within each ridge set 1295, localized groupings of ridges 1291-B may exhibit different material compositions (as described in greater detail below with respect to FIG. 13).

Figure 12C:
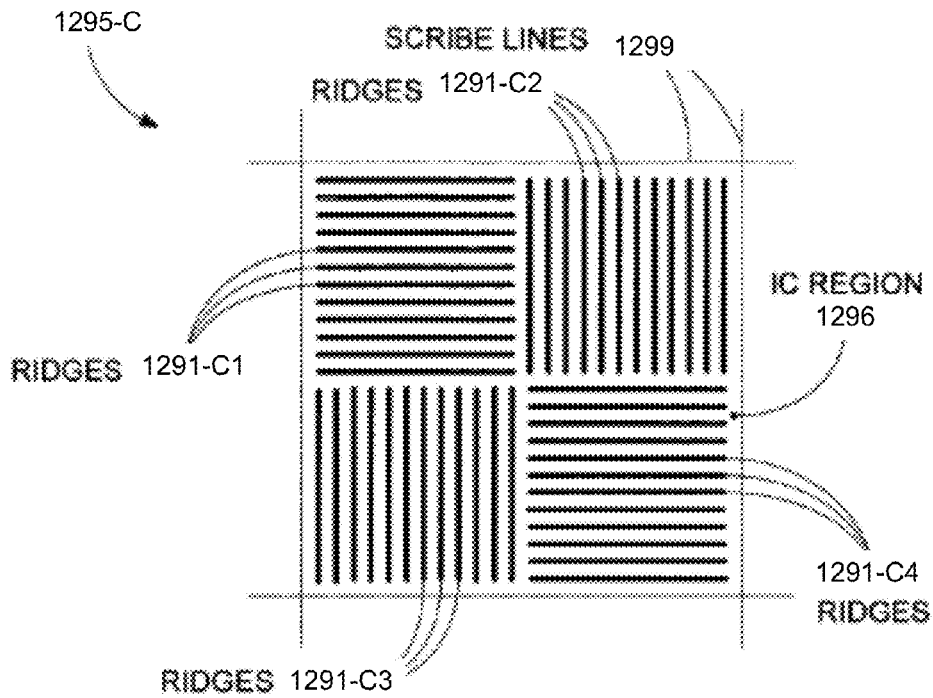

Note further that while ridges 1291-B are all shown running in the same direction for exemplary purposes, according to various other embodiments, a corrugated substrate can include multiple localized ridge sets, wherein the ridges in different sets run in different directions. For example, FIG. 12C shows a top view of an alternative localized ridge set 1295-C that could be implemented in place of localized ridge sets 1295 in FIG. 12B. Localized ridge set 1295-C includes a ridge set including parallel ridges 1291-C1, a ridge set including parallel ridges 1291-C2, a ridge set including parallel ridges 1291-C3, and a ridge set including parallel ridges 1291-C4. As described with respect to FIG. 12B, optional ridge isolation material can separate the ridges in each of the ridge sets. Parallel ridges 1291-C1 and 1291-C4 run perpendicular to parallel ridges 1291-C2 and 1291-C3. Any other arrangement of ridges can provide the benefits described above, so long as the ridges in any particular set of parallel ridges are longer than the critical dimension (i.e., the minimum geometry) of the devices being formed using the ridges. Note, however, that the ridges themselves may actually be thinner than the critical dimension (since the ridges can be manufactured using techniques other than those ordinarily used in actual device production, as described above). Note further that while the areas occupied by parallel ridges 1291-C1, 1291-C2, 1291-C3, and 1291-C4 are depicted as being roughly equal for exemplary purposes, the different ridge groupings within a die location (i.e., between scribe lines) can exhibit any desired sizing relationship with one another.

Figure 12D:
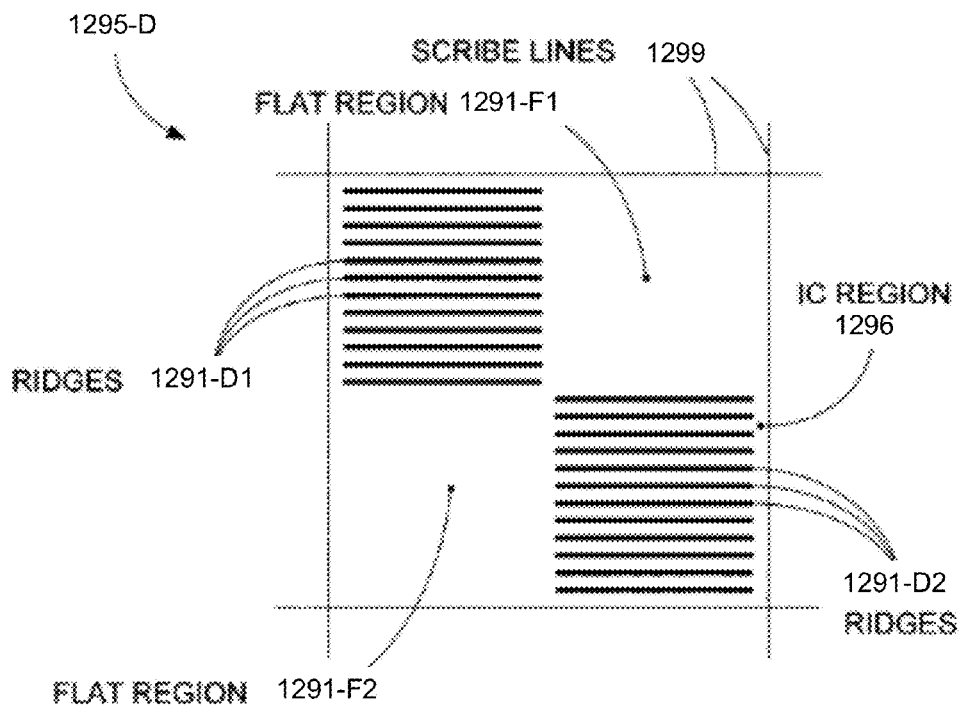

Note further that a corrugated substrate can include large planar semiconductor surface regions. For example, FIG. 12D shows a top view of an alternative localized ridge set 1295-D that could be implemented in place of localized ridge sets 1295 in FIG. 12B. Localized ridge set 1295-D includes a ridge set including parallel ridges 1291-D1 (separated by optional ridge isolation material), a ridge set including parallel ridges 1291-D2 (separated by optional ridge isolation material), and planar (unridged) semiconductor surface regions 1291-F1 and 1291-F2. Conventional planar semiconductor devices (i.e., transistors, resistors, and/or capacitors) can be formed in these planar semiconductor surface regions 1291-F1 and 1291-F2 simultaneously with corrugated-semiconductor devices, e.g. by using the fabrication process flow described above. Note that while planar semiconductor surface regions 1291-F1 and 1291-F2 are depicted as covering roughly the same area as parallel ridges 1291-D1 and 1291-D2 for exemplary purposes, groupings of parallel ridges and planar regions can exhibit any relative sizing. Note further that a portion of a corrugated substrate can be considered a planar region so long as that portion provides an unridged area that is at least as wide as two ridges plus the spacing between those two ridges.

Ideally, a corrugated substrate will include sets of parallel ridges that cover an area at least as large as a basic functional block (e.g., a set of devices that performs a particular logic function). A corrugated substrate providing ridge sets sized in this manner can beneficially minimize the need for additional interconnect wiring between devices within functional blocks. Larger ridge sets can likewise minimize interconnect wiring requirements between functional blocks.

Figure 13:
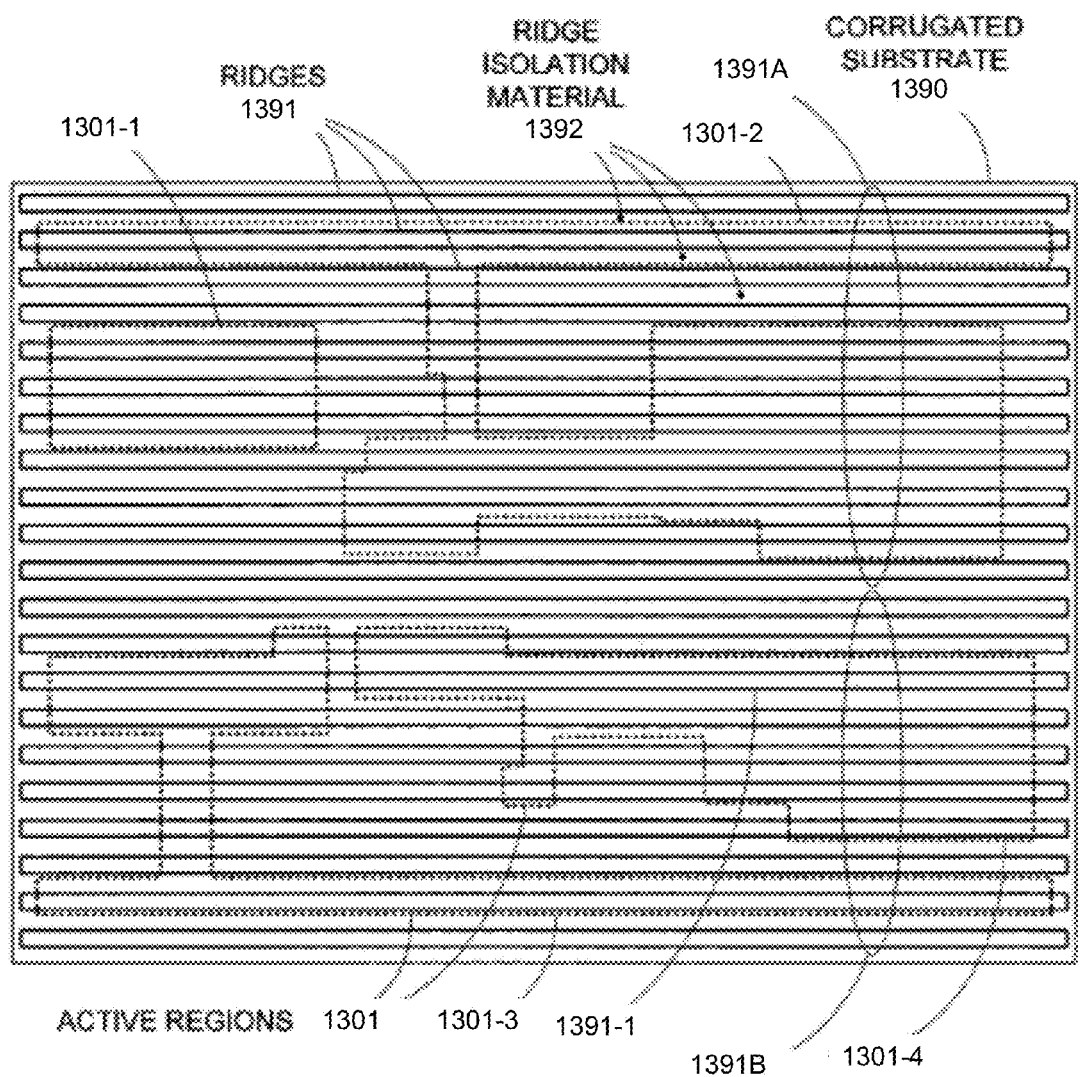
FIG. 13 shows a corrugated substrate incorporating features of the invention, and further showing locations where functional elements of a circuit are to be formed.

For example, FIG. 13 shows a corrugated substrate 1390 that includes a set of parallel ridges 1391, optionally supplied with ridge isolation material 1392 present between ridges 1391 (alternatively, a dielectric formation operation can be performed to form ridge isolation material 1392. Ridges 1391 are substantially similar to ridges 1191 described previously, and have a predetermined height (HR in FIG. 11), width (WR in FIG. 11), spacing (SP in FIG. 11), and composition. Active regions 1301 (indicated by the dotted lines) represent locations where functional elements of a circuit are to be formed.

Note that while ridges 1391 are dimensionally very similar, the composition of ridges 1391 can vary. For example, in ridge group 1391A the silicon forming the layers 1002, 1004 and 1006 can have (110) surface crystalline orientation, whereas in ridge group 1391B the silicon forming the layers 1002, 1004 and 1006 can have (001) surface crystalline orientation. Then, if active regions 1301-1 and 1301-2 represent regions in which PMOS devices are to be formed, the ridges 1391 in ridge group 1391A provide a surface crystalline orientation optimized for PMOS performance. Similarly, if active regions 1301-3 and 1301-4 represent regions in which NMOS devices are to be formed, the ridges 1391 in ridge group 1391B provide a surface crystalline orientation optimized for NMOS performance.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features. In view of the foregoing description it will be evident to a person skilled in the art that various modifications may be made within the scope of the invention.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. In particular, and without limitation, any and all variations described, suggested or incorporated by reference in the Background section of this patent application are specifically incorporated by reference into the description herein of embodiments of the invention. In addition, any and all variations described, suggested or incorporated by reference herein with respect to any one embodiment are also to be considered taught with respect to all other embodiments. The embodiments described herein were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. A method for fabricating an integrated circuit transistor structure comprising steps of:
   providing an intermediate structure comprising:
      a body of material, the body having an adjustment layer comprising adjustment volume material, and an upper layer of semiconductor material, the upper layer overlying the adjustment layer,
      a gate conductor outside the body, the gate conductor having portions facing the body on at least three sides of the body and defining a channel volume of the body, the body having first and second longitudinally opposite end surfaces, the gate conductor extending beyond the body in both longitudinal directions, and a dielectric material between the gate conductor and the body;

forming first and second additional semiconductor material on respectively the first and second end surfaces of the body; and forming source and drain volumes longitudinally adjacent to respectively the first and second additional semiconductor material, wherein the adjustment volume material has, at each longitudinal position, an electrical conductivity which differs from that of the upper layer of semiconductor material at the same longitudinal position, at least while the transistor is in an off-state, wherein the first additional material is less conductive than the source material, at least when the transistor is in the off state, and wherein the second additional material is less conductive than the drain material, at least when the transistor is in the off state.

2. The method of claim 1, wherein the adjustment volume material comprises a dielectric.

3. The method of claim 1, wherein the adjustment volume material comprises an electrical conductor.

4. The method of claim 1, wherein the adjustment volume material comprises a material having a bandgap which is wider than that of the semiconductor material in the upper layer.

5. The method of claim 1, wherein the adjustment volume material comprises a plurality of sub-layers of material.

6. The method of claim 1, wherein the body of material further has a lower layer of semiconductor material underlying the adjustment layer.

7. The method of claim 6, wherein the upper and lower layers of semiconductor material are the same.

8. The method of claim 1, wherein the adjustment volume material in the body of material is spaced laterally from the dielectric material by a further material that includes a semiconductor.

9. The method of claim 1, further comprising a step of forming further semiconductor material laterally between the body and the dielectric material.

10. The method of claim 1, wherein the second additional material is a semiconductor material with a doping type that is opposite that of the source and drain materials, respectively.

11. A wafer comprising a first plurality of parallel ridges formed on a substrate, wherein each of the ridges comprises:
an adjustment layer including adjustment volume material; and
an upper layer of semiconductor material overlying the adjustment layer,
wherein the adjustment volume material comprises semiconductor material,
and wherein the ridges are epitaxially grown in such a way that the adjustment volume material is doped more heavily than all layers of semiconductor material above the adjustment layer.

12. The wafer of claim 11, wherein each of the ridges has two laterally opposing surfaces,
further comprising, on each of the laterally opposing surfaces, a semiconductor material which is less heavily doped than the adjustment volume material.

13. The wafer of claim 11, wherein the adjustment volume material comprises a plurality of sub-layers of material.

14. The wafer of claim 11, wherein each of the ridges further has a lower layer of semiconductor material underlying the adjustment layer.

15. The wafer of claim 14, wherein the upper and lower layers of semiconductor material are the same.

16. The wafer of claim 14, wherein the ridges are epitaxially grown in such a way that the adjustment volume material is doped more heavily also than the lower layer of semiconductor material.

17. The wafer of claim 11, wherein each of the ridges further has gate stack material formed thereon.

18. The wafer of claim 11, wherein all the ridges in the first plurality of parallel ridges extend substantially all the way across the substrate.

19. The wafer of claim 11, further comprising a second plurality of ridges formed on the substrate.

20. The wafer of claim 11, wherein the substrate is scribed into dice,
and wherein all the ridges in the first plurality of parallel ridges extend only within a first one of the dice and extend substantially all the way across the first die.

21. The wafer of claim 11, wherein the substrate is scribed into dice,
further comprising a second plurality of ridges formed on the substrate,
wherein all the ridges in the first plurality of parallel ridges extend only within a first one of the dice and all the ridges in the second plurality of parallel ridges extend only within a second one of the dice.

22. A method for fabricating a wafer comprising:
forming a first plurality of parallel ridges on a substrate, wherein each of the ridges includes an adjustment layer including adjustment volume material and an upper layer of semiconductor material overlying the adjustment layer,
wherein the adjustment volume material comprises semiconductor material,
and wherein the ridges are epitaxially grown in such a way that the adjustment volume material is doped more heavily than all layers of semiconductor material above the adjustment layer.

23. The method of claim 22, wherein each of the ridges has two laterally opposing surfaces,
further comprising forming, on each of the laterally opposing surfaces, a semiconductor material which is less heavily doped than the adjustment volume material.

24. The method of claim 22, wherein the adjustment volume material includes a plurality of sub-layers of material.

25. The method of claim 22, wherein each of the ridges further has a lower layer of semiconductor material underlying the adjustment layer.

26. The method of claim 25, wherein the upper and lower layers of semiconductor material are the same.

27. The method of claim 25, wherein the ridges are epitaxially grown in such a way that the adjustment volume material is doped more heavily also than the lower layer of semiconductor material.

28. The method of claim 22, further comprising forming gate stack material on each of the ridges.

29. The method of claim 22, wherein all the ridges in the first plurality of parallel ridges extend substantially all the way across the substrate.

30. The method of claim 22, further comprising forming a second plurality of ridges formed on the substrate.

31. The method of claim 22, further comprising scribing the substrate into dice,
and wherein all the ridges in the first plurality of parallel ridges extend only within a first one of the dice and extend substantially all the way across the first die.

32. The method of claim 22, further comprising scribing the substrate into dice,
and further comprising forming a second plurality of ridges on the substrate,
wherein all the ridges in the first plurality of parallel ridges extend only within a first one of the dice and all the ridges in the second plurality of parallel ridges extend only within a second one of the dice.

33. A wafer comprising a first plurality of parallel ridges formed on a substrate, wherein each of the ridges comprises:
an adjustment layer including adjustment volume material; and
an upper layer of semiconductor material overlying the adjustment layer, the upper layer of semiconductor material having a bandgap which is no wider than that of GaP,
wherein the adjustment volume material comprises semiconductor material,
and wherein the ridges are epitaxially grown in such a way that the adjustment volume material is doped more heavily than the upper layer of semiconductor material.

34. The wafer of claim 33, wherein each of the ridges has two laterally opposing surfaces,
further comprising, on each of the laterally opposing surfaces, a semiconductor material which is less heavily doped than the adjustment volume material.

35. The wafer of claim 33, wherein the adjustment volume material comprises a plurality of sub-layers of material.

36. The wafer of claim 33, wherein each of the ridges further has a lower layer of semiconductor material underlying the adjustment layer.

37. The wafer of claim 36, wherein the upper and lower layers of semiconductor material are the same.

38. The wafer of claim 36, wherein the ridges are epitaxially grown in such a way that the adjustment volume material is doped more heavily also than the lower layer of semiconductor material.

39. The wafer of claim 33, wherein each of the ridges further has gate stack material formed thereon.

40. The wafer of claim 33, wherein all the ridges in the first plurality of parallel ridges extend substantially all the way across the substrate.

41. The wafer of claim 33, further comprising a second plurality of ridges formed on the substrate.

42. The wafer of claim 33, wherein the substrate is scribed into dice,
and wherein all the ridges in the first plurality of parallel ridges extend only within a first one of the dice and extend substantially all the way across the first die.

43. The wafer of claim 33, wherein the substrate is scribed into dice,
further comprising a second plurality of ridges formed on the substrate,
wherein all the ridges in the first plurality of parallel ridges extend only within a first one of the dice and all the ridges in the second plurality of parallel ridges extend only within a second one of the dice.

44. A method for fabricating a wafer comprising:
forming a first plurality of parallel ridges on a substrate,
wherein each of the ridges includes an adjustment layer including adjustment volume material and an upper layer of semiconductor material overlying the adjustment layer,
wherein the upper layer of semiconductor material has a bandgap which is no wider than that of GaP,
wherein the adjustment volume material comprises semiconductor material,
and wherein the ridges are epitaxially grown in such a way that the adjustment volume material is doped more heavily than the upper layer of semiconductor material.

45. The method of claim 44, wherein each of the ridges has two laterally opposing surfaces,
further comprising forming, on each of the laterally opposing surfaces, a semiconductor material which is less heavily doped than the adjustment volume material.

46. The method of claim 44, wherein the adjustment volume material includes a plurality of sub-layers of material.

47. The method of claim 44, wherein each of the ridges further has a lower layer of semiconductor material underlying the adjustment layer.

48. The method of claim 47, wherein the upper and lower layers of semiconductor material are the same.

49. The method of claim 47, wherein the ridges are epitaxially grown in such a way that the adjustment volume material is doped more heavily also than the lower layer of semiconductor material.

50. The method of claim 44, further comprising forming gate stack material on each of the ridges.

51. The method of claim 44, wherein all the ridges in the first plurality of parallel ridges extend substantially all the way across the substrate.

52. The method of claim 44, further comprising forming a second plurality of ridges formed on the substrate.

53. The method of claim 34, further comprising scribing the substrate into dice,
and wherein all the ridges in the first plurality of parallel ridges extend only within a first one of the dice and extend substantially all the way across the first die.

54. A method for designing a first integrated circuit transistor,
wherein the first transistor is to include:
a body of semiconductor material, the body having first and second longitudinally spaced doped source/drain volumes and further having at least a first surface, the body further having a channel volume located longitudinally between the first and second source/drain volumes,
a gate conductor disposed outside the body, the gate conductor having a first portion facing the first surface and being located longitudinally at least partly along at least part of the channel volume, and
a dielectric material between the gate conductor and the first surface of the body,
the body containing an adjustment volume, longitudinally within the channel volume and spaced behind the first surface by a first distance, spaced longitudinally from the first source/drain volume by a second distance, and spaced longitudinally from the second source/drain volume,
the adjustment volume comprising an adjustment volume material having an electrical conductivity which differs from that of the adjacent body material at each longitudinal position, at least while the first transistor is in an off-state;
the method comprising the steps of:
choosing for the first transistor, in dependence upon at least one of the factors in the group consisting of desired switching speed, desired leakage current, desired Ion/Ioff ratio and desired mechanical stress, values for at least one of the parameters in the group consisting of:
the first distance,
the second distance,
adjustment material conductivity, and the adjustment volume material; and
implementing the chosen values in the design of the first transistor.

55. The method of claim 54, wherein choosing for the first transistor, is performed in dependence upon at least one of the factors in the group consisting of desired switching speed, desired leakage current, and desired Ion/Ioff ratio for the first transistor.

56. The method of claim 54, wherein choosing for the first transistor, is performed in dependence upon desired mechanical stress for the first transistor.

57. The method of claim 54, wherein choosing for the first transistor, includes choosing a value for the first distance.

58. The method of claim 54, wherein choosing for the first transistor, includes choosing a value for the second distance.

59. The method of claim 54, wherein choosing for the first transistor, includes choosing a value for the adjustment material conductivity.

60. The method of claim 54, wherein choosing for the first transistor, includes choosing a value for the adjustment volume material.

61. A product made by the method of:
providing an intermediate structure comprising:
a body of material, the body having an adjustment layer comprising adjustment volume material, and an upper layer of semiconductor material, the upper layer overlying the adjustment layer,
a gate conductor outside the body, the gate conductor having portions facing the body on at least three sides of the body and defining a channel volume of the body, the body having first and second longitudinally opposite end surfaces, the gate conductor extending beyond the body in both longitudinal directions, and
a dielectric material between the gate conductor and the body;
forming first and second additional semiconductor material on respectively the first and second end surfaces of the body; and
forming source and drain volumes longitudinally adjacent to respectively the first and second additional semiconductor material,
wherein the adjustment volume material has, at each longitudinal position, an electrical conductivity which differs from that of the upper layer of semiconductor material at the same longitudinal position, at least while the transistor is in an off-state,
wherein the first additional material is less conductive than the source material, at least when the transistor is in the off state,
and wherein the second additional material is less conductive than the drain material, at least when the transistor is in the off state.

62. An integrated circuit transistor structure comprising:
a body of semiconductor material, the body having first and second longitudinally spaced doped source/drain volumes and further having at least first and second non-coplanar surfaces, the body further having a channel volume located longitudinally between the first and second source/drain volumes;
a gate conductor disposed outside the body, the gate conductor having a first portion facing the first surface and a second portion facing the second surface and being located longitudinally at least partly along at least part of the channel volume; and
a dielectric material between the first portion of the gate conductor and the first surface of the body and between the second portion of the gate conductor and the second surface of the body,
the body containing an adjustment volume, longitudinally within the channel volume and spaced behind the first surface by a first distance and spaced behind the second surface by a second distance and spaced longitudinally from both the first and second source/drain volumes,
wherein the adjustment volume comprises an adjustment volume material having, at each longitudinal position, an electrical conductivity which differs from that of the adjacent body material at the same longitudinal position, at least while the transistor is in an off-state.

63. An integrated circuit transistor structure comprising:
a body of semiconductor material, the body having first and second longitudinally spaced doped source/drain volumes and further having at least a first surface, the body further having a channel volume located longitudinally between the first and second source/drain volumes;
a gate conductor disposed outside the body, the gate conductor having a first portion facing the first surface and being located longitudinally at least partly along at least part of the channel volume; and
a dielectric material between the gate conductor and the first surface of the body,
the body containing a dielectric material, spaced behind the first surface by a first distance and spaced longitudinally from both the first and second source/drain volumes, and disposed laterally within the channel volume so as to block off-state leakage current.

64. A method for fabricating an integrated circuit transistor structure comprising steps of:
providing a body of semiconductor material, the body having first and second longitudinally spaced doped source/drain volumes and further having at least first and second non-coplanar surfaces, the body further having a channel volume located longitudinally between the first and second source/drain volumes;
forming a gate conductor outside the body, the gate conductor having a first portion facing the first surface and a second portion facing the second surface and being located longitudinally at least partly along at least part of the channel volume;
forming a dielectric material between the first portion of the gate conductor and the first surface of the body and between the second portion of the gate conductor and the second surface of the body; and
forming an adjustment volume in the body, the adjustment volume being disposed longitudinally within the channel volume and spaced behind the first surface by a first distance and spaced behind the second surface by a second distance and spaced longitudinally from both the first and second source/drain volumes,
wherein the adjustment volume comprises an adjustment volume material having, at each longitudinal position, an electrical conductivity which differs from that of the adjacent body material at the same longitudinal position, at least while the transistor is in an off-state.

* * * * *